United States Patent
Homol et al.

(10) Patent No.: US 9,762,192 B2
(45) Date of Patent: *Sep. 12, 2017

(54) CMOS RF SWITCH DEVICE AND METHOD FOR BIASING THE SAME

(71) Applicant: Skyworks Solutions, Inc., Woburn, MA (US)

(72) Inventors: David K. Homol, Kernersville, NC (US); Hua Wang, High Point, NC (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/059,925

(22) Filed: Mar. 3, 2016

(65) Prior Publication Data
US 2016/0294342 A1    Oct. 6, 2016

Related U.S. Application Data

(62) Division of application No. 14/500,636, filed on Sep. 29, 2014, now Pat. No. 9,294,073, which is a division
(Continued)

(51) Int. Cl.
*H04B 1/04* (2006.01)
*H03F 1/14* (2006.01)
(Continued)

(52) U.S. Cl.
CPC ............ *H03F 3/72* (2013.01); *G05F 1/468* (2013.01); *G05F 1/565* (2013.01); *G05F 1/575* (2013.01);
(Continued)

(58) Field of Classification Search
CPC .......... H04B 1/0458; H04B 1/44; H04B 1/04; H01Q 3/24; H03F 1/14
See application file for complete search history.

(56) References Cited

U.S. PATENT DOCUMENTS

| 4,998,075 A | 3/1991 | Patton et al. |
| 5,548,246 A | 8/1996 | Yamamoto et al. |

(Continued)

FOREIGN PATENT DOCUMENTS

| JP | 2011-188102 A | 9/2011 |
| WO | WO 2011/156289 | 12/2011 |

OTHER PUBLICATIONS

International Preliminary Report on Patentability in PCT/US2011/039328 (WO2011/156289), dated Dec. 10, 2012.
(Continued)

*Primary Examiner* — Blane Jackson
(74) *Attorney, Agent, or Firm* — Knobbe, Martens, Olson & Bear, LLP

(57) ABSTRACT

Disclosed are CMOS-based devices for switching radio frequency (RF) signals and methods for biasing such devices. In certain RF devices such as mobile phones, providing different amplification modes can yield performance advantages. For example, a capability to transmit at low and high power modes typically results in an extended battery life, since the high power mode can be activated only when needed. Switching between such amplification modes can be facilitated by one or more switches formed in an integrated circuit and configured to route RF signal to different amplification paths. In certain embodiments, such RF switches can be formed as CMOS devices, and can be based on triple-well structures. In certain embodiments, an isolated well of such a triple-well structure can be provided with different bias voltages for on and off states of the switch to yield desired performance features during switching of amplification modes.

23 Claims, 14 Drawing Sheets

Related U.S. Application Data of application No. 12/844,333, filed on Jul. 27, 2010, now Pat. No. 8,880,014.

(60) Provisional application No. 61/352,330, filed on Jun. 7, 2010.

(51) Int. Cl.

| | | |
|---|---|---|
| *H03F 3/68* | (2006.01) | |
| *H03F 3/72* | (2006.01) | |
| *H02M 3/158* | (2006.01) | |
| *G05F 1/565* | (2006.01) | |
| *H03F 1/02* | (2006.01) | |
| *H03H 11/30* | (2006.01) | |
| *H03F 3/217* | (2006.01) | |
| *H03G 3/30* | (2006.01) | |
| *G05F 1/46* | (2006.01) | |
| *G05F 1/575* | (2006.01) | |
| *H03F 1/34* | (2006.01) | |
| *H03F 3/19* | (2006.01) | |
| *H03F 3/21* | (2006.01) | |
| *H01L 27/092* | (2006.01) | |
| *H01L 29/06* | (2006.01) | |
| *H03F 1/56* | (2006.01) | |
| *H03F 3/195* | (2006.01) | |
| *H03F 3/24* | (2006.01) | |
| *H03K 17/687* | (2006.01) | |
| *H04B 1/40* | (2015.01) | |

(52) U.S. Cl.
CPC ...... *H01L 27/0928* (2013.01); *H01L 29/0611* (2013.01); *H02M 3/1584* (2013.01); *H03F 1/0261* (2013.01); *H03F 1/34* (2013.01); *H03F 1/56* (2013.01); *H03F 3/19* (2013.01); *H03F 3/195* (2013.01); *H03F 3/211* (2013.01); *H03F 3/217* (2013.01); *H03F 3/245* (2013.01); *H03G 3/30* (2013.01); *H03G 3/3042* (2013.01); *H03H 11/30* (2013.01); *H03K 17/6872* (2013.01); *H04B 1/40* (2013.01); *H03F 2200/18* (2013.01); *H03F 2200/411* (2013.01); *H03F 2200/451* (2013.01); *H03F 2203/21131* (2013.01); *H03F 2203/21139* (2013.01); *H03F 2203/7215* (2013.01); *Y10T 307/406* (2015.04)

(56) References Cited

U.S. PATENT DOCUMENTS

| | | |
|---|---|---|
| 5,574,678 A | 11/1996 | Gorecki |
| 5,654,577 A | 8/1997 | Nakamura et al. |
| 5,748,134 A | 5/1998 | Dent |
| 6,218,895 B1 | 4/2001 | De et al. |
| 6,281,737 B1 | 8/2001 | Kuang et al. |
| 6,307,233 B1 | 10/2001 | Awaka et al. |
| 6,504,212 B1 | 1/2003 | Allen et al. |
| 6,680,650 B2 | 1/2004 | Gupta |
| 6,804,502 B2 | 10/2004 | Burgener et al. |
| 6,828,845 B2 | 12/2004 | Pennock et al. |
| 6,870,241 B2 | 3/2005 | Nakatani et al. |
| 6,917,095 B1 | 7/2005 | Wong et al. |
| 6,996,376 B2 | 2/2006 | Clifton |
| 7,342,291 B2 | 3/2008 | Vogelsang |
| 7,868,683 B2 | 1/2011 | Ilkov |
| 8,039,925 B2 | 10/2011 | Wong et al. |
| 8,279,010 B2 | 10/2012 | Seki et al. |
| 8,368,463 B2 | 2/2013 | Homol et al. |
| 8,369,805 B2 | 2/2013 | Homol et al. |
| 8,461,921 B2 | 6/2013 | Pletcher et al. |
| 8,519,795 B2 | 8/2013 | Watanabe et al. |
| 8,587,373 B2 | 11/2013 | Sasaki et al. |
| 8,587,375 B2 | 11/2013 | Kim et al. |
| 8,847,672 B2 | 9/2014 | Prabhakar, III et al. |
| 8,880,014 B2 | 11/2014 | Homol et al. |
| 9,294,073 B2 | 3/2016 | Homol et al. |
| 2002/0071230 A1 | 6/2002 | Colclaser et al. |
| 2002/0075614 A1 | 6/2002 | Li |
| 2002/0136325 A1 | 9/2002 | Pehlke et al. |
| 2003/0232609 A1 | 12/2003 | Yates |
| 2004/0100323 A1 | 5/2004 | Khanifar et al. |
| 2008/0024229 A1 | 1/2008 | Dupuis et al. |
| 2008/0116972 A1 | 5/2008 | McMorrow |
| 2009/0073078 A1 | 3/2009 | Ahn et al. |
| 2009/0167270 A1 | 7/2009 | Lam et al. |
| 2010/0001351 A1 | 1/2010 | Zhang et al. |
| 2011/0105055 A1 | 5/2011 | Ilkov |
| 2011/0151642 A1 | 6/2011 | Chang et al. |
| 2011/0273355 A1 | 11/2011 | Ahn et al. |
| 2013/0016447 A1 | 1/2013 | Kitabata et al. |

OTHER PUBLICATIONS

International Search Report in PCT/US2011/039328 (WO 2011/156289), dated Jan. 18, 2012.
Written Opinion of the International Search Authority in PCT/US2011/039328 (WO 2011/156289), dated Jan. 18, 2012.
International Search Report and Written Opinion re International Application No. PCT/US2013/020902 mailed on Apr. 30, 2013.

CMOS RF SWITCH DEVICE AND METHOD FOR BIASING THE SAME

INCORPORATION BY REFERENCE TO ANY PRIORITY APPLICATIONS

This application is a divisional of U.S. patent application Ser. No. 14/500,636, filed Sep. 29, 2014, which is a divisional of U.S. patent application Ser. No. 12/844,333, filed Jul. 27, 2010, now U.S. Pat. No. 8,880,014, which claims the benefit of priority under 35 U.S.C. §119(e) of U.S. Provisional Patent Application No. 61/352,330, entitled "Circuits & Systems," filed Jun. 7, 2010, each of which is hereby incorporated herein by reference in its entirety to be considered part of this specification. Any and all applications for which a foreign or domestic priority claim is identified in the Application Data Sheet as filed with the present application are hereby incorporated by reference under 37 CFR 1.57.

BACKGROUND

Field

The present disclosure generally relates to the field of electronics, and more particularly, to systems and methods for configuring and operating semiconductor switches for processing of radio frequency (RF) signals.

Description of the Related Art

In many electronic devices, radio frequency (RF) signal is amplified for processing. In wireless RF devices such as cellular phones, such amplification can facilitate transmission of RF signals at different output powers. Such a capability can enhance a wireless device's operating time by conserving power usage when permitted (e.g., when the device is close to a cell) and increasing the power output only when needed (e.g., when the device is far from a cell).

In many situations involving switching between two or more power output settings, RF signals can be routed to different power amplifiers to be amplified with different gains. It is desirable that such switching of RF signals, as well as the amplification process itself, have certain performance characteristics.

SUMMARY

In certain embodiments, the present disclosure relates to a circuit for amplifying radio frequency signals, the circuit includes a first circuit configured to amplify a radio frequency (RF) signal so as to provide a first gain. The circuit further includes a second circuit configured to amplify the RF signal so as to provide a second gain. The circuit further includes a switch having source and drain, a gate between the source and the drain, and a first well formed about the source and drain. The circuit further includes a control component configured to control application of first and second bias voltages to the first well, with the first and second bias voltages for the first well being different and corresponding to the first and second states of the switch, respectively. In certain embodiments, at least the switch is formed as a complementary metal oxide semiconductor (CMOS) device.

In various embodiments, the control component is further configured to control application of first and second gate bias voltages that correspond to the first and second states of the switch, respectively. In some embodiments, the first state of the switch results in the RF signal being amplified by the first circuit, and the second state of the switch results in the RF signal being amplified by the second circuit.

In a number of embodiments, the switch further includes a second well configured to substantially isolate the first well from the semiconductor substrate. In certain embodiments, the first and second wells are parts of a triple-well CMOS structure.

In accordance with several embodiments, each of the first and second circuits includes one or more power amplifiers, and the switch is connected in series to the one or more power amplifiers of the first circuit such that the first and second states of the switch correspond to ON and OFF states of the switch, respectively. In certain embodiments, the first gain provided by the one or more power amplifiers of the first circuit is lower than the second gain provided by the one or more power amplifiers of the second circuit. In certain embodiments, the first and second bias voltages for the first well are selected for the ON and OFF states of the switch so as to provide the circuit with a desirable linearity when providing both first and second amplification gains.

According to some embodiments, at least one of the one or more power amplifiers of the first circuit is formed on the CMOS substrate. In certain embodiments, at least one of the one or more power amplifiers of the second circuit is formed on the CMOS substrate.

In some embodiments, a CMOS die can include the foregoing circuit. In certain embodiments, a multi-chip module can include the foregoing circuit. In certain embodiments, a wireless device can include the foregoing circuit. In certain embodiments, the wireless device includes a cellular phone.

In certain embodiments, the present disclosure relates to a tangible computer-readable medium having stored thereon computer-executable instructions that, if executed by one or more computing devices, cause the one or more computing devices to perform operations. The instructions include determining whether to amplify a radio frequency (RF) signal by a first gain or a second gain. The first gain is achievable by a first circuit having one or more power amplifiers and configured to be turned on or off by a triple-well CMOS switch having an isolated well about the switch's source, gate, and drain, the switch in the on state resulting in the RF signal being amplified by the first gain, and the switch in the off state resulting in the RF signal being amplified by the second gain. The instructions further include applying or inducing application of a first bias voltage to the isolated well upon determination that the RF signal is to be amplified by the first gain. The instructions further include applying or inducing application of a second bias voltage to the isolated well upon determination that the RF signal is to be amplified by the second gain. The first and second bias voltages to the isolated well are different.

In accordance with a number of embodiments, the instructions further include applying or inducing application of a first bias voltage to the gate upon determination that the RF signal is to be amplified by the first gain, and applying or inducing application of a second bias voltage to the gate upon determination that the RF signal is to be amplified by the second gain.

In various embodiments, the first bias voltage to the isolated well is substantially equal to a bias voltage applied to the source and the drain when the switch is on. In certain embodiments, the first bias voltage applied to the gate is held at a substantially fixed amount above the first bias voltage applied to the isolated well. In certain embodiments, the substantially fixed amount includes a quantity that is N times a threshold voltage value, where the quantity N is a positive integer. In certain embodiments, the second bias voltage to the isolated well is substantially equal to the second bias voltage applied to the gate.

According to some embodiments, the isolated well is coupled to the source and drain such that the bias voltage applied to the isolated well substantially tracks a bias voltage applied to the source and drain. In certain embodiments, the bias voltage applied to the source and drain is substantially equal to a voltage provided by a supply that is powering the first and second circuits such that the bias voltage applied to the isolated well substantially tracks the supply voltage even when the supply voltage changes.

In certain embodiments, the present disclosure relates to a radio frequency switch having a first-type silicon substrate and a second-type isolation well formed in the substrate. The switch further includes a first-type isolated well separated from the substrate by the isolation well. The switch further includes source and drain disposed in the isolated well. The switch further includes a gate disposed on the isolated well so as to allow switching on and off of electrical conduction between the source and drain by application of different bias gate voltages. The switch further includes and/or is under control of a bias voltage control component electrically connected to the gate, the isolated well, and the isolation well. The bias voltage control component is configured to facilitate application of the different gate voltages for on and off states of the switch. The bias voltage control component is further configured to facilitate application of different bias voltages to at least one of the isolated well and the isolation well for the on and off states of the switch.

In various embodiments, the first-type is a p-type and the second-type is an n-type. In certain embodiments, the isolation well includes an N-well and a deep N-well, such that in combination with the isolated well, the N-well and the deep N-well form a triple-well structure in the silicon substrate. In certain embodiments, the gate includes a gate terminal and an oxide layer between the gate terminal and the isolated well so as to form a CMOS structure.

In some embodiments, the bias voltage control component includes a voltage distribution component configured to distribute the different bias voltages to the at least one of the isolated well and the isolation well based on the on or off state of the switch.

In certain embodiments, the present disclosure relates to a method for controlling amplification radio frequency signals. The method includes determining whether to amplify a radio frequency (RF) signal by a first gain or a second gain, with the first gain achievable by a first circuit having one or more power amplifiers and configured to be turned on or off by a triple-well CMOS switch having an isolated well about the switch's source, gate, and drain. The switch in the on state results in the RF signal being amplified by the first gain, and the switch in the off state results in the RF signal being amplified by the second gain. The method further includes applying or inducing application of a first bias voltage to the isolated well upon determination that the RF signal is to be amplified by the first gain. The method further includes applying or inducing application of a second bias voltage to the isolated well upon determination that the RF signal is to be amplified by the second gain. In certain embodiments, the first and second bias voltages to the isolated well are different.

In certain embodiments, the present disclosure relates to a system for amplifying radio frequency signals. The system includes a means for amplifying a radio frequency (RF) signal so as to provide first and second gains. The system further includes a means for switching a complementary metal oxide semiconductor (CMOS) switch between first and second states, with the switch having source and drain, a gate between the source and the drain, and a first well formed about the source and drain. The switch is configured to be capable of being in the first and second states so as to facilitate the amplification of the RF signal by the first and second gains. The system further includes a means for controlling the application of the first and second gate bias voltages, and to further control application of first and second bias voltages to the first well, with the first and second bias voltages for the first well being different and corresponding to the first and second states of the switch, respectively.

In certain embodiments, the present disclosure relates to a circuit for amplifying radio frequency signals. The circuit includes a first circuit configured to amplify a radio frequency (RF) signal so as to provide a first gain, and a second circuit configured to amplify the RF signal so as to provide a second gain. The circuit further includes a switch having source and drain, a gate between the source and the drain, and a first well formed about the source and drain. The first well is electrically coupled to at least one of the source and the drain such that the first well is at an electrical potential that is substantially fixed relative to an electrical potential of the at least one of the source and the drain. The circuit further includes a control component configured to control application of first and second bias voltages to the at least one of the source and the drain so as to yield first and second bias voltages for the first well that substantially track the first and second bias voltages for the at least one of the source and the drain. The first and second bias voltages for the first well can be different and correspond to the first and second states of the switch, respectively. In certain embodiments, at least the switch is formed as a complementary metal oxide semiconductor (CMOS) device.

In various embodiments, the control component is further configured to control application of first and second gate bias voltages that correspond to the first and second states of the switch, respectively. In some embodiments, the first state of the switch results in the RF signal being amplified by the first circuit, and the second state of the switch results in the RF signal being amplified by the second circuit.

In some embodiments, the electrical potential of the first well is substantially the same as the electrical potential of the at least one of the source and the drain. In certain embodiments, the electrical potential of the source is substantially the same as the electrical potential of the drain.

In a number of embodiments, the first well is electrically coupled to the at least one of the source and the drain via an inductor choke having one its ends connected to the at least one of the source and the drain. In certain embodiments, the other end of the inductor choke is connected directly to the first well. In certain embodiments, the other end of the inductor choke is connected indirectly to the first well by a charge pump.

In some embodiments, the first well is part of a triple-well CMOS structure.

In accordance with several embodiments, each of the first and second circuits includes one or more power amplifiers, and the switch is connected in series to the one or more power amplifiers of the first circuit such that the first and second states of the switch correspond to ON and OFF states of the switch, respectively.

According to some embodiments, a CMOS die can include the foregoing circuit. In certain embodiments, a multi-chip module can include the foregoing circuit. In certain embodiments, a wireless device can include the foregoing circuit. In certain embodiments, the wireless device includes a cellular phone.

In various embodiments, the first and second bias voltages to the at least one of the source and the drain of the switch is substantially the same as a voltage supplied by a battery for the cellular phone.

In certain embodiments, the present disclosure relates to a tangible computer-readable medium having stored thereon computer-executable instructions that, if executed by one or more computing devices, cause the one or more computing devices to perform operations. The instructions include determining whether to amplify a radio frequency (RF) signal by a first gain or a second gain, with the first gain achievable by a first circuit having one or more power amplifiers and configured to be turned on or off by a triple-well CMOS switch having an isolated well about the switch's source, gate, and drain. The switch in the on state results in the RF signal being amplified by the first gain, and the switch in the off state results in the RF signal being amplified by the second gain. The instructions further include applying or inducing application of a first bias voltage to the isolated well upon determination that the RF signal is to be amplified by the first gain. The instructions further include applying or inducing application of a second bias voltage to the isolated well upon determination that the RF signal is to be amplified by the second gain. In certain embodiments, at least the first bias voltage to the isolated well is substantially fixed relative to a bias voltage applied to at least one of the source and drain of the switch.

In various embodiments, the bias voltage applied to the at least one of the source and drain of the switch is substantially the same as a supply voltage. In certain embodiments, the supply voltage is applied to both of the source and drain of the switch. In certain embodiments, the first bias voltage to the isolated well is substantially equal to the bias voltage applied to the source and the drain when the switch is on.

In accordance with a number of embodiments, the instructions further include applying or inducing application of a first bias voltage to the gate upon determination that the RF signal is to be amplified by the first gain, and applying or inducing application of a second bias voltage to the gate upon determination that the RF signal is to be amplified by the second gain. In certain embodiments, the first bias voltage applied to the gate is held at a substantially fixed amount above the first bias voltage applied to the isolated well. In certain embodiments, the substantially fixed amount includes a quantity that is N times a threshold voltage value, where the quantity N is a positive integer.

In certain embodiments, the present disclosure relates to a radio frequency switch having a first-type silicon substrate and a second-type isolation well formed in the substrate. The switch further includes a first-type isolated well separated from the substrate by the isolation well. The switch further includes source and drain disposed in the isolated well. The switch further includes a gate disposed on the isolated well so as to allow switching on and off of electrical conduction between the source and drain by application of different bias gate voltages. The isolated well is electrically coupled to a supply such that a bias voltage applied to the isolated well is substantially fixed to a voltage provided by the supply.

According to some embodiments, the first-type is a p-type and the second-type is an n-type. In certain embodiments, the isolation well includes an N-well and a deep N-well, such that in combination with the isolated well, the N-well and the deep N-well form a triple-well structure in the silicon substrate. In certain embodiments, the gate includes a gate terminal and an oxide layer between the gate terminal and the isolated well so as to form a CMOS structure. In certain embodiments, the bias voltage bias voltage supplied to the isolated well is substantially the same as the voltage provided by the supply.

In certain embodiments, the present disclosure relates to a method for controlling amplification radio frequency signals. The method includes determining whether to amplify a radio frequency (RF) signal by a first gain or a second gain. The first gain is achievable by a first circuit having one or more power amplifiers and configured to be turned on or off by a triple-well CMOS switch having an isolated well about the switch's source, gate, and drain, with the switch in the on state resulting in the RF signal being amplified by the first gain, and the switch in the off state resulting in the RF signal being amplified by the second gain. The method further includes applying or inducing application of a first bias voltage to the isolated well upon determination that the RF signal is to be amplified by the first gain. The method further includes applying or inducing application of a second bias voltage to the isolated well upon determination that the RF signal is to be amplified by the second gain. In certain embodiments, at least the first bias voltage to the isolated well is substantially fixed relative to a bias voltage applied to at least one of the source and drain of the switch.

In certain embodiments, the present disclosure relates to a system for amplifying radio frequency signals. The system includes a means for amplifying a radio frequency (RF) signal so as to provide first and second gains. The system further includes a means for switching a complementary metal oxide semiconductor (CMOS) switch between first and second states. The switch includes source and drain, a gate between the source and the drain, and a first well formed about the source and drain. The switch is configured to be capable of being in the first and second states so as to facilitate the amplification of the RF signal by the first and second gains. The system further includes a means for controlling application of first and second bias voltages to the at least one of the source and the drain so as to yield first and second bias voltages for the first well that substantially track the first and second bias voltages for the at least one of the source and the drain. In certain embodiments, the first and second bias voltages for the first well is different and correspond to the first and second states of the switch, respectively.

In certain embodiments, the present disclosure relates to a circuit for amplifying radio frequency signals. The circuit includes a first circuit configured to amplify a radio frequency (RF) signal so as to provide a first gain, and a second circuit configured to amplify the RF signal so as to provide a second gain. The circuit further includes a switch having a source and a drain, a gate between the source and the drain, a first well formed about the source and drain, and a second well formed about the first well. The circuit further includes a voltage distribution component configured to provide different bias voltages to at least one of the first and second wells. In certain embodiments, at least the switch is formed as a complementary metal oxide semiconductor (CMOS) device.

In various embodiments, the switch is configured to be capable of being in first second states by application of first and second gate bias voltages, respectively. In some embodiments, the first state of the switch results in the RF signal being amplified by the first circuit, and the second state of the switch results in the RF signal being amplified by the second circuit.

In accordance with some embodiments, the first and second wells are parts of a triple-well CMOS structure. In certain embodiments, the voltage distribution component is further configured provide the first and second gate bias voltages. In certain embodiments, the voltage distribution component is configured to provide different bias voltages for the first and second states of the switch to each of the first and second wells. In certain embodiments, the voltage distribution component is further configured to pass through at least one input bias voltage as a single output. In certain embodiments, the voltage distribution component is further configured to provide the different bias voltages based on an input control logic signal.

According to a number of embodiments, each of the first and second circuits includes one or more power amplifiers, and the switch is connected in series to the one or more power amplifiers of the first circuit such that the first and second states of the switch correspond to ON and OFF states of the switch, respectively. In certain embodiments, the first gain provided by the one or more power amplifiers of the first circuit is lower than the second gain provided by the one or more power amplifiers of the second circuit. In certain embodiments, the first and second bias voltages for the first well are selected for the ON and OFF states of the switch so as to provide the circuit with a desirable linearity when providing both first and second amplification gains.

In some embodiments, at least one of the one or more power amplifiers of the first circuit is formed on the CMOS substrate. In certain embodiments, at least one of the one or more power amplifiers of the second circuit is formed on the CMOS substrate.

In a number of embodiments, a CMOS die can include the foregoing circuit. In certain embodiments, a multi-chip module can include the foregoing circuit. In certain embodiments, a wireless device can include the foregoing circuit. In certain embodiments, the wireless device includes a cellular phone.

In certain embodiments, the present disclosure relates to a tangible computer-readable medium having stored thereon computer-executable instructions that, if executed by one or more computing devices, cause the one or more computing devices to perform operations. The instructions include determining whether to amplify a radio frequency (RF) signal by a first gain or a second gain. The first gain is achievable by a first circuit having one or more power amplifiers and configured to be turned on or off by a triple-well CMOS switch having an isolated well about the switch's source and drain, and an isolation well about the isolated well, with the switch in the on state resulting in the RF signal being amplified by the first gain, and the switch in the off state resulting in the RF signal being amplified by the second gain. The instructions further include generating a control signal for application of bias voltages to the switch. In certain embodiments, the control signal is formatted so as to allow application of different bias voltages for the on and off states of the switch to at least one of the isolated and isolation wells.

In various embodiments, the instructions further include applying or inducing application of a bias voltage for the on state of the switch to the at least one of the isolated and isolation wells upon determination that the RF signal is to be amplified by the first gain.

According to some embodiments, the instructions further include applying or inducing application of a bias voltage for the off state of the switch to the at least one of the isolated and isolation wells upon determination that the RF signal is to be amplified by the second gain.

In a number of embodiments, the control signal is further formatted to allow application of different bias voltages for the on and off states of the switch to the gate.

In certain embodiments, the present disclosure relates to a radio frequency switch having a first-type silicon substrate and a second-type isolation well formed in the substrate. The switch further includes a first-type isolated well separated from the substrate by the isolation well. The switch further includes source and drain disposed in the isolated well. The switch further includes a gate disposed on the isolated well so as to allow switching on and off electrical conduction between the source and drain by application of different bias gate voltages. The switch further includes and/or is coupled to a voltage distribution component electrically connected to the gate and at least one of the isolated and isolation wells. The voltage distribution component is configured to provide different bias voltages for the on and off states of the switch to at least one of the isolated and isolation wells.

According to some embodiments, the first-type is a p-type and the second-type is an n-type. In certain embodiments, the isolation well includes an N-well and a deep N-well, such that in combination with the isolated well, the N-well and the deep N-well form a triple-well structure in the silicon substrate. In certain embodiments, the gate includes a gate terminal and an oxide layer between the gate terminal and the isolated well so as to form a CMOS structure.

In certain embodiments, the present disclosure relates to a method for controlling amplification radio frequency signals. The method includes determining whether to amplify a radio frequency (RF) signal by a first gain or a second gain. The first gain is achievable by a first circuit having one or more power amplifiers and configured to be turned on or off by a triple-well CMOS switch having an isolated well about the switch's source and drain, and an isolation well about the isolated well, with the switch in the on state resulting in the RF signal being amplified by the first gain, and the switch in the off state resulting in the RF signal being amplified by the second gain. The method further includes generating a control signal for application of bias voltages to the switch, with the control signal formatted so as to allow application of different bias voltages for the on and off states of the switch to at least one of the isolated and isolation wells.

In certain embodiments, the present disclosure relates to a system for amplifying radio frequency signals. The system includes a means for amplifying a radio frequency (RF) signal so as to provide first and second gains. The system further includes a means for switching a complementary metal oxide semiconductor (CMOS) switch between first and second states. The switch includes source and drain, a gate between the source and the drain, and a first well formed about the source and drain. The switch is configured to be capable of being in the first and second states so as to facilitate the amplification of the RF signal by the first and second gains. The system further includes a means for distributing different bias voltages for the first and second states of the switch to at least one of the first and second wells.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

The present disclosure relates to U.S. patent application Ser. No. 12/844,246, titled "HIGH LINEARITY CMOS RF SWITCH PASSING LARGE SIGNAL AND QUIESCENT POWER AMPLIFIER CURRENT," and U.S. patent application Ser. No. 12/844,640, titled "VOLTAGE DISTRIBUTION FOR CONTROLLING CMOS RF SWITCH," each filed on even date herewith and each hereby incorporated by reference herein in its entirety.

DETAILED DESCRIPTION OF CERTAIN EMBODIMENTS

The headings provided herein, if any, are for convenience only and do not necessarily affect the scope or meaning of the claimed invention.

Figure 1:
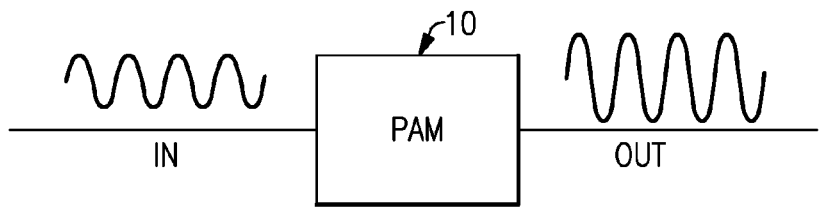
FIG. 1 schematically depicts a power amplifier module for amplifying a radio frequency (RF) signal.

Provided herein are various non-limiting examples of devices and methods for facilitating amplification of a radio frequency (RF) signal. FIG. 1 schematically depicts a power amplifier module (PAM) 10 that can be configured to achieve such an amplification of the RF signal so as to yield an output RF signal. As described herein, the power amplifier module can include one or more power amplifiers (PA).

Figure 2:
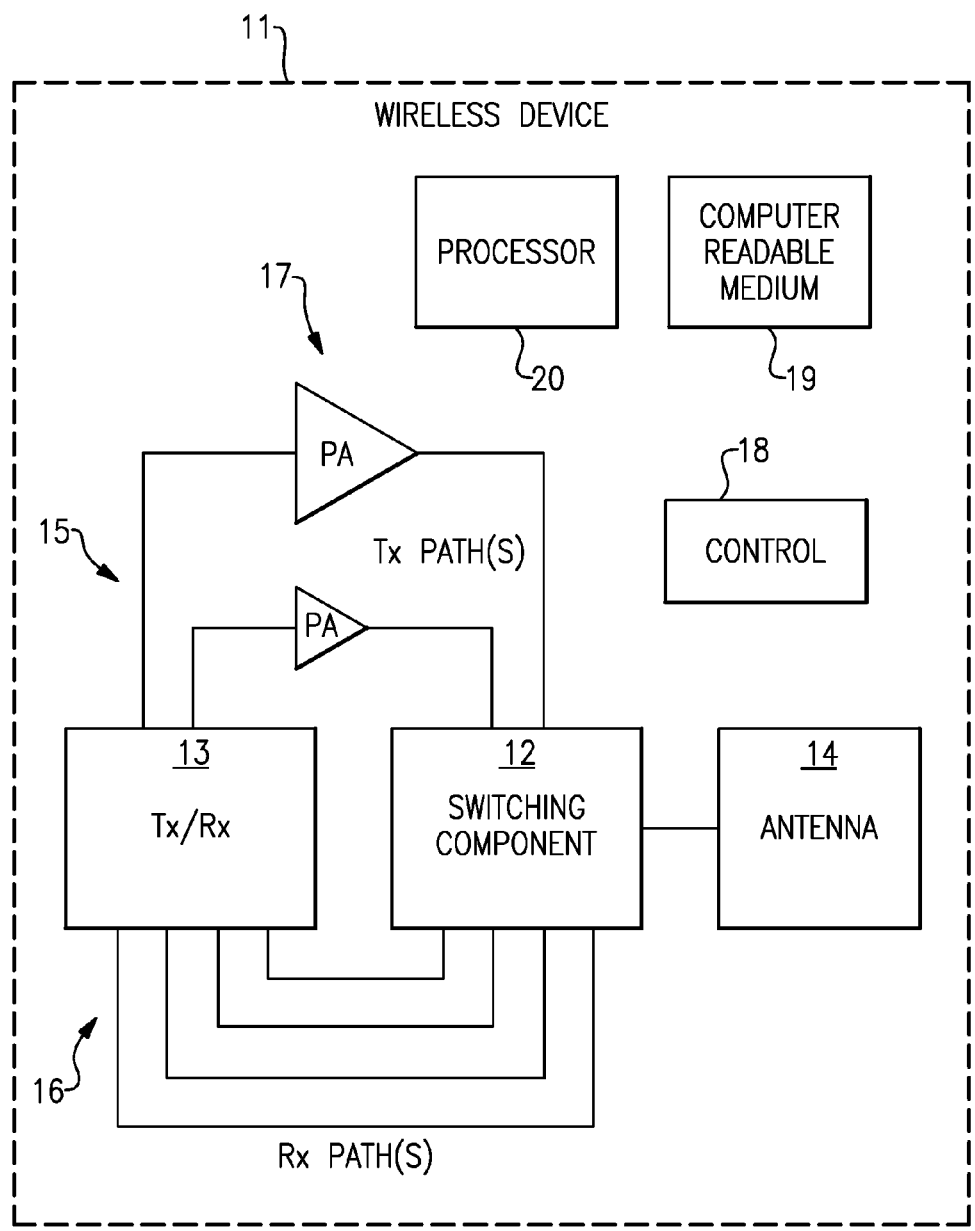
FIG. 2 schematically depicts an example wireless device that can have one or more of the power amplifier modules of FIG. 1 configured to provide one or more functionalities as described herein.

FIG. 2 schematically depicts a device 11, such as a wireless device, for which one or more power amplifiers controlled by one or more features of the present disclosure can be implemented. The example wireless device 11 depicted in FIG. 2 can represent a multi-band and/or multi-mode device such as a multi-band/multi-mode mobile phone.

By way of examples, Global System for Mobile (GSM) communication standard is a mode of digital cellular communication that is utilized in many parts of the world. GSM mode mobile phones can operate at one or more of four frequency bands: 850 MHz (approximately 824-849 MHz for Tx, 869-894 MHz for Rx), 900 MHz (approximately 880-915 MHz for Tx, 925-960 MHz for Rx), 1800 MHz (approximately 1710-1785 MHz for Tx, 1805-1880 MHz for Rx), 1900 MHz (approximately 1850-1910 MHz for Tx, 1930-1990 MHz for Rx). Variations and/or regional/national implementations of the GSM bands are also utilized in different parts of the world.

Code division multiple access (CDMA) is another standard that can be implemented in mobile phone devices. In certain implementations, CDMA devices can operate in one or more of 900 MHz and 1900 MHz bands.

One or more features of the present disclosure can be implemented in the foregoing example modes and/or bands, and in other communication standards. For example, 3G and 4G are non-limiting examples of such standards.

In certain embodiments, the wireless device 11 can include a transceiver component 13 configured to generate RF signals for transmission via an antenna 14, and receive incoming RF signals from the antenna 14. It will be understood that various functionalities associated with the transmission and receiving of RF signals can be achieved by one or more components that are collectively represented in FIG. 2 as the transceiver 13. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 2 as the antenna 14. For example, a single antenna can be configured to provide both transmitting and receiving functionalities. In another example, transmitting and receiving functionalities can be provided by separate antennas. In yet another example, different bands associated with the wireless device 11 can be provided with one or more antennas.

In FIG. 2, one or more output signals from the transceiver 13 are depicted as being provided to the antenna 14 via one or more transmission paths 15. In the example shown, different transmission paths 15 can represent output paths associated with different bands and/or different power outputs. For example, two example power amplifiers 17 shown can represent amplifications associated with different power output configurations (e.g., low power output and high power output), and/or amplifications associated with different bands.

In FIG. 2, one or more detected signals from the antenna 14 are depicted as being provided to the transceiver 13 via one or more receiving paths 16. In the example shown, different receiving paths 16 can represent paths associated with different bands. For example, the four example paths 16 shown can represent quad-band capability that some wireless devices are provided with.

FIG. 2 shows that in certain embodiments, a switching component 12 can be provided, and such a component can be configured to provide a number of switching functionalities associated with an operation of the wireless device 11. In certain embodiments, the switching component 12 can include a number of switches configured to provide functionalities associated with, for example, switching between different bands, switching between different power modes, switching between transmission and receiving modes, or some combination thereof. Various non-limiting examples of such switches are described herein in greater detail.

FIG. 2 shows that in certain embodiments, a control component 18 can be provided, and such a component can be configured to provide various control functionalities associated with operations of the switching component 12, the power amplifiers 17, and/or other operating component(s). Non-limiting examples of the control component 18 are described herein in greater detail.

FIG. 2 shows that in certain embodiments, a processor 20 can be configured to facilitate implementation of various processes described herein. For the purpose of description, embodiments of the present disclosure may also be described with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the acts specified in the flowchart and/or block diagram block or blocks.

In certain embodiments, these computer program instructions may also be stored in a computer-readable memory (19 in FIG. 2) that can direct a computer or other programmable data processing apparatus to operate in a particular manner, such that the instructions stored in the computer-readable memory produce an article of manufacture including instruction means which implement the acts specified in the flowchart and/or block diagram block or blocks. The computer program instructions may also be loaded onto a computer or other programmable data processing apparatus to cause a series of operations to be performed on the computer or other programmable apparatus to produce a computer implemented process such that the instructions that execute on the computer or other programmable apparatus provide steps for implementing the acts specified in the flowchart and/or block diagram block or blocks.

Figure 3A:
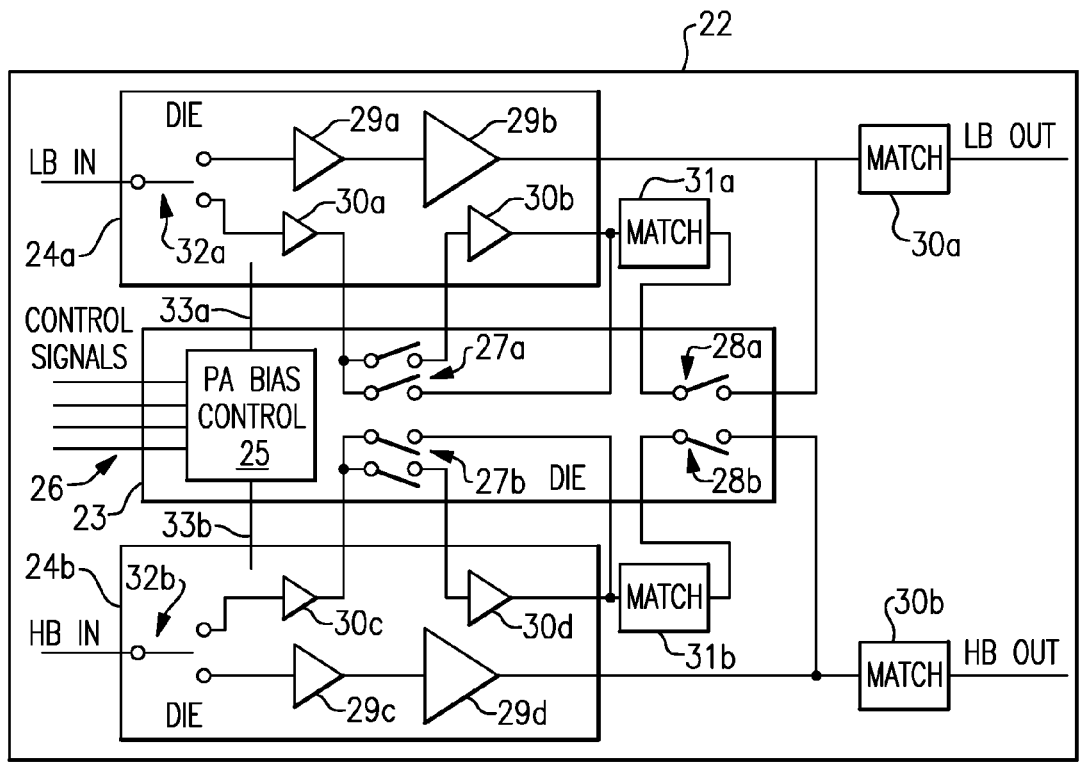
FIGS. 3A and 3B show example system architectures that can be implemented in the wireless device of FIG. 2.
Figure 3B:
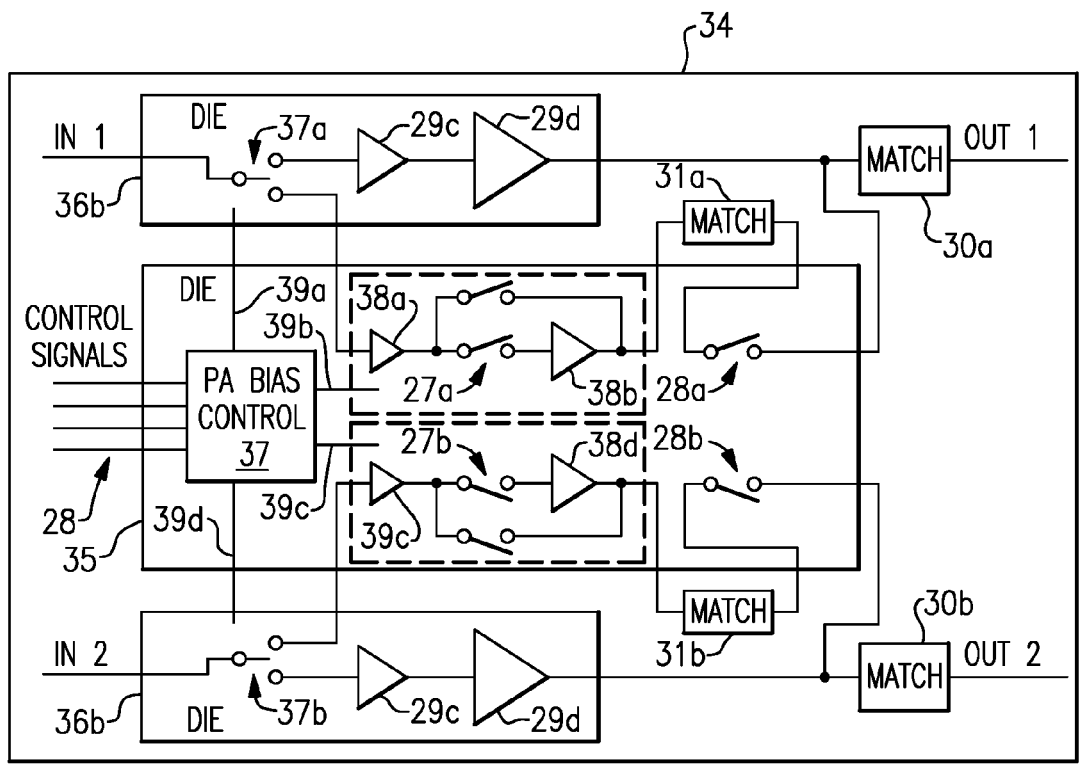

FIGS. 3A and 3B show non-limiting examples of system architectures that can include one or more features of the present disclosure. For the purpose of description, the example architectures are depicted with two RF bands; however, it will be understood that other numbers of RF bands are also possible. For example, system architectures having similar functionalities can be implemented in configurations having more than two bands (e.g., quad-band) or a single-band configuration.

In one example architecture 22, a first RF input indicated as "LB IN" and corresponding to a first band (e.g., a low band) can be amplified by one or more power amplifiers disposed and/or formed on a die 24a. Such amplified output RF signal is indicated as "LB OUT," and can be subjected to impedance matching (e.g., to approximately 50Ω) by a component depicted as 30a. Similarly, a second RF input indicated as "HB IN" and corresponding to a second band (e.g., a high band) can be amplified by one or more power amplifiers disposed and/or formed on a die 24b. Such amplified output RF signal is indicated as "HB OUT," and can be subjected to impedance matching by a component depicted as 30b (e.g., to approximately 50Ω).

In certain embodiments, amplification for a given RF band can include two or more amplification modes. For the example low RF band, the RF input LB IN can be routed to a high power amplification mode or a low/medium power amplification mode via a switch depicted as 32a. If the switch 32a is set for the high power mode, the RF signal can undergo amplification by one or more power amplifiers (e.g., by staged amplifiers 29a and 29b) so as to yield a high power output. If the switch 32a is set for the low/medium power mode, the RF signal can undergo amplification by one or more power amplifiers.

In certain embodiments, the switch 32a need not be employed. For example, the input impedance of the staged amplifiers 29a and 30a can be substantially matched, and the RF input LB IN can be provided to both staged amplifiers 29a and 30a.

In the example shown, a low power mode can be achieved by utilizing a power amplifier 30a; and a medium power mode can be achieved by amplifying the RF signal in stages by the power amplifier 30a and a second power amplifier 30b. Examples of switching and routing of the RF signals to allow selection of the low, medium and high power operating modes are described herein in greater detail. The low/medium amplified output RF signal can be subjected to impedance matching by a component depicted as 31a prior to being output in a manner similar to that of the high power output signal.

Similarly, for the example high RF band, the RF input HB IN can be routed to a high power amplification mode or a low/medium power amplification mode via a switch depicted as 32b. If the switch 32b is set for the high power mode, the RF signal can undergo amplification by one or more power amplifiers (e.g., by staged amplifiers 29c and 29d) so as to yield a high power output.

If the switch 32b is set for the low/medium power mode, the RF signal can undergo amplification by one or more power amplifiers. In the example shown, a low power mode can be achieved by utilizing a power amplifier 30c; and a medium power mode can be achieved by amplifying the RF signal in stages by the power amplifier 30c and a second power amplifier 30d. Examples of switching and routing of the RF signals to allow selection of the low, medium and high power operating modes are described herein in greater detail. The low/medium amplified output RF signal can be subjected to impedance matching by a component depicted as 31b prior to being output in a manner similar to that of the high power output signal.

In the example architecture 22 depicted in FIG. 3A, operation of the low and medium power modes can be facilitated by switch assemblies 27a, 28a (for the low band) and 27b, 28b (for the high band). To operate in a low or medium power mode, for the low band, the switch 28a can be closed, and the switch 32a can be in a state that routes the LB IN signal to the power amplifier 30a. To operate in a medium power mode, a connecting switch (depicted as the upper one in the switch assembly 27a) can be closed and a bypass switch (depicted as the lower one) can be opened, such that the power amplifiers 30a and 30b amplify the LB IN signal in stages to yield the medium power output. To operate in a low output mode, the connecting switch of the switch assembly 27a can be opened and the bypass switch of the switch assembly 27a can be closed, such that the LB IN signal is amplified by the power amplifier 30a by bypasses the power amplifier 30b so as to yield the low power output. Operation of low or medium power mode for the high band can be achieved in a similar manner utilizing the switch assemblies 27b and 28b.

In the example configuration 22 shown in FIG. 3A, various switches (e.g., 27a, 27b, 28a, 28b) are depicted as being part of a die 23. In certain embodiments, the die 23 can also include a power amplifier bias control component 25. The PA bias control component 25 is depicted as controlling the example PAs (29a, 29b, 30a, 30b of the low band portion, and 29c, 29d, 30c, 30d of the high band portion) via bias control lines depicted as 33a and 33b. In certain embodiments, the PA bias control component 25 can be provided with one or more input control signals 26 so as to facilitate one or more functionalities associated with various PAs as described herein.

In certain embodiments, various switches and power amplifiers associated with the dies depicted as 24a, 24b can be fabricated on substrates such as gallium arsenide (GaAs) utilizing devices such as pseudomorphic high electron mobility transistors (pHEMT) or bipolar field effect transistors (BiFET). In certain embodiments, the dies depicted as 24a, 24b in FIG. 3A can be formed on the same GaAs substrate, or on separate GaAs substrates. Further, functionalities associated with the dies depicted as 24a, 24b can be formed on a single die, or on separate dies.

In certain embodiments, various switches (e.g., 27a, 27b, 28a, 28b) associated with operation of various PAs (e.g., 29a, 29b, 30a, 30b of the low band portion, and 29c, 29d, 30c, 30d of the high band portion) can be fabricated as complementary metal-oxide-semiconductor (CMOS) devices. In certain embodiments, at least some of the PA bias control component 25 can be implemented on a CMOS die. In the example shown in FIG. 3A, the switches (e.g., 27a, 27b, 28a, 28b) and the PA bias control component 25 are depicted as being parts of the same CMOS die 26. In certain embodiments, such switches and PA bias control component can be parts of different CMOS dies.

In certain embodiments, at least one power amplifier and one or more switches associated with its operation can be implemented on a CMOS die. FIG. 3B shows an example architecture 34 that can generally provide dual-band signal amplification functionalities similar to that described in reference to FIG. 3A. In FIG. 3B, "IN 1" and "OUT 1" can represent the low band input and output LB IN and LB out; and "IN 2" and "OUT 2" can represent the high band input and output HB IN and HB OUT. Further, switching functionality associated with switches 32a and 32b can be provided by switches 37a and 37b. For high power mode of operation, PAs 29a, 29b, 29c, 29d that are parts of dies 36a, 36b can be similar to the dies 24a, 24b described in reference to FIG. 3A.

In FIG. 3B, power amplifiers 38a, 38b, 38c, 38d corresponding to the medium/low power modes are depicted as being formed on the same die 35 (e.g., CMOS die) on which the switches (e.g., 27a, 27b, 28a, 28b) are formed. Other than these components being on the same CMOS die, operation of the example medium/low power modes can be achieved in a manner similar to those described in reference to FIG. 3A.

Similar to FIG. 3A, the example configuration 34 of FIG. 3B includes a PA bias control component 37 that is part of the example CMOS die 35. The PA bias control component 37 is depicted as receiving one or more input control signals 28 and controlling one or more functionalities associated with the various PAs. The PAs (e.g., 29a, 29b for the first band, and 29c, 29d for the second band) associated with the high power mode are depicted as being controlled via bias control lines 39a and 39b. The PAs (e.g., 38a, 38b for the first band, and 38c, 38d for the second band) associated with the medium/low mode are depicted as being controlled via bias control lines 39c and 39d.

It will be understood that the configurations 22 and 34 of FIGS. 3A and 3B are specific examples of design architectures that can be implemented. There are a number of other configurations that can be implemented utilizing one or more features of the present disclosure.

Figure 4A:
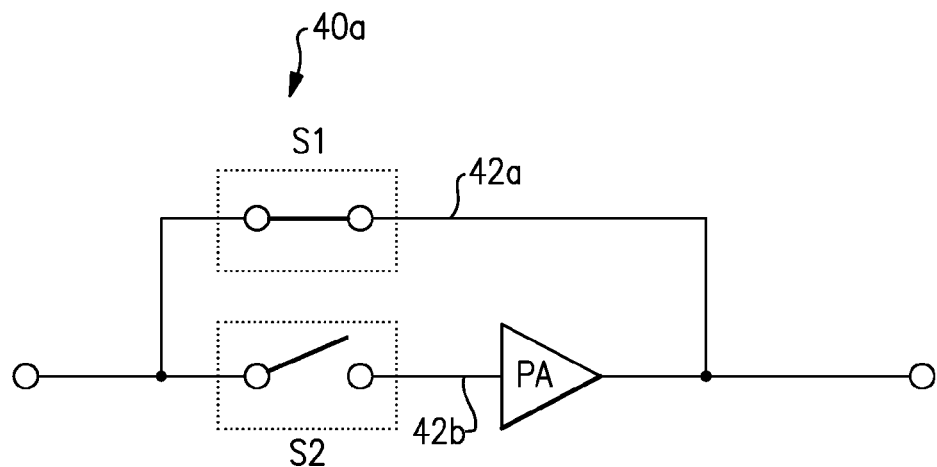
FIGS. 4A and 4B schematically depict an example of how an RF signal to a power amplifier can be switched ON or OFF.
Figure 4B:
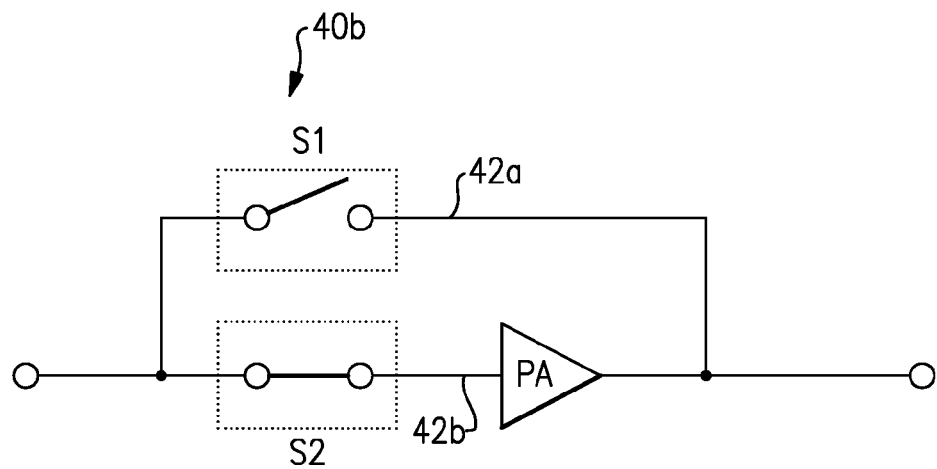

In the context of switches for RF power amplifiers, FIGS. 4A and 4B shows a switching configuration 40 that can form a basis for more complex architectures. In a signal path configuration 40a of FIG. 4A, an RF signal can be routed through a first path 42a by providing a switch S1 that is closed. In the configuration 40a, second path 42b is depicted as having a switch S2 that is open and a power amplifier. Thus, for the purpose of operating the power amplifier in the example path 42b, the configuration 40a can represent an OFF state.

In a signal path configuration 40b of FIG. 4B that can represent an ON state for the power amplifier, the switch S2 on the second path 42b is closed and the switch S1 on the first path 42a is open. For the purpose of description of FIGS. 4A and 4B, the first example path 42a is depicted without any component other than the switch S1. It will be understood that there may be one or more components (e.g., one or more power amplifiers) along the first path 42a.

In the context of power amplifiers that can be included in portable and/or wireless devices (e.g., mobile phones), a power amplifier system can be subjected to varying processes and operating conditions such as voltage and temperature variations. For example, a power amplifier system can be powered using a variable supply voltage, such as a battery of a mobile phone.

In certain situations, it can be important for a power amplifier system to switch between power modes so that the power amplifier switch can control power consumption. For example, in a mobile device embodiment, having a plurality of power modes allows the power amplifier to extend battery life. Control signals, such as mode input signals received on a pin or pad, can be used to indicate a desired mode of operation. The power amplifier system can include a plurality of RF signal pathways, which can pass through power amplification stages of varying gain. Switches can be inserted in and/or about these pathways, and switch control logic can be used to enable the switches and power amplifiers associated with the selected power amplifier RF signal pathway.

Placing a switch in a signal path of a power amplifier (e.g., in the example signal path 42b of FIGS. 4A and 4B) can produce a number of effects. For example, insertion of a switch into a RF signal pathway can result in a loss of signal power due to radiation and resistive losses. Additionally, even a switch in an OFF state placed along an active RF signal pathway can attenuate a RF signal. Thus, it can be important that the switch introduce low insertion loss in both ON and OFF states. Furthermore, it can be important that the switch be highly or acceptably linear, so as to reduce distortion of a RF signal which passes through the switch. Distortion can reduce the fidelity of an RF signal; and reduction of such distortion can be important in a mobile system embodiment.

In certain embodiments, switches can be integrated on a mixed-transistor integrated circuit (IC) having power amplification circuitry, such as a BiFET, BiCMOS die employing silicon or GaAs technologies. Additionally, switches can be provided on a discrete die, such as a pHEMT RF switch die, and can be configured to interface with a mixed-transistor power amplifier die to implement a configurable power amplifier system. However, these approaches can be relatively expensive and consume significant amounts of area as compared to a silicon CMOS technology. Power consumption and the area of a power amplifier system can be important considerations, such as in mobile system applications. Thus, there is a need for employing a CMOS switch in a RF signal power amplifier system.

In certain embodiments, CMOS RF switches can be relatively large, so that the switch resistance in an ON-state can be relatively small so as to minimize RF insertion loss. However, large CMOS RF switches can have undesirable parasitic components, which can cause significant leakages and cause damage to RF signal fidelity. Additionally, the wells and active areas of the CMOS RF switches can have associated parasitic diode and bipolar structures. Without proper control of the wells of a CMOS RF switch, parasitic structures may become active and increase the power consumption of the power amplifier system and potentially render the system dysfunctional. Furthermore, CMOS devices are susceptible to breakdown, such as gate oxide breakdown, and other reliability concerns, so it can be important to properly bias a CMOS RF switch during operation.

In certain embodiments, one or more switches described herein can be selectively activated depending on a variety of factors, including, for example, a power mode of the power amplifier system. For example, in a high power mode a CMOS RF switch may be positioned in an OFF state and configured to be in a shunt configuration with the active RF signal path. The isolated P-well voltage of such a switch can be controlled to both prevent overvoltage or other stress conditions which may endanger the reliability, while optimizing or improving the linearity of the switch. The linearity of the RF signal pathway having a shunt CMOS switch in an OFF-state can be improved by keeping the isolated P-well voltage at a selected voltage (e.g., relatively low voltage) so as to avoid forward biasing of parasitic diode structures formed between the P-well and the N-type diffusion regions of the source and drain. By preventing the forward-biasing of parasitic diode structures, the injection of unintended current into the active RF signal pathway can be avoided, thereby increasing linearity of the power amplifier system.

Figure 5:
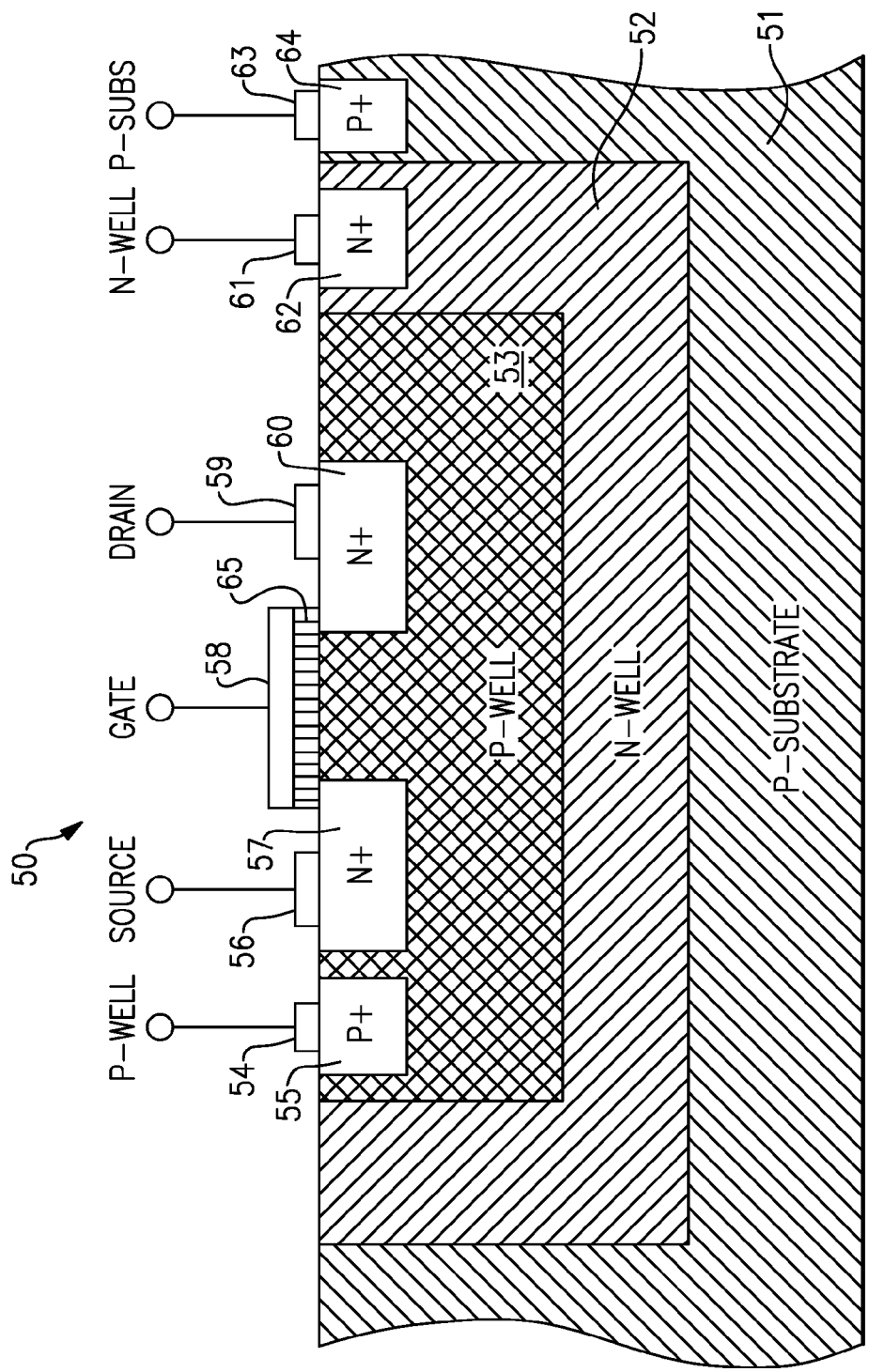
FIG. 5 shows that in certain embodiments, the switch depicted in FIGS. 4A and 4B can be formed as a triple-well CMOS device.

In certain embodiments, some or all of the foregoing example properties can be addressed by one or more features associated with a CMOS RF switch, such as a switch 50 depicted in FIG. 5. The example switch 50 can include a triple-well structure having an N-well 52 and a P-well 53 formed on a P-type substrate 51. As shown in FIG. 5, the N-well 52 can surround the P-well 53 so as to electrically isolate the P-well 53 from the substrate 51. The N-well 52 can be formed by using, for example, a deep N-well or any other suitable N-type buried layer.

The switch 50 further includes a source terminal 56 and a drain terminal 59. An oxide layer 65 is disposed on the P-well 53, and a gate 58 is disposed on top of the oxide layer 65. An N-type source diffusion region and an N-type drain diffusion region corresponding to the source and drain terminals (56, 59) are depicted as regions 57 and 60, respectively. In certain embodiments, formation of the triple-well structure and the source, drain and gate terminals thereon can be achieved in a number of known ways.

In certain operating situations, an input signal can be provided to the source terminal 56. Whether the switch 50 allows the input signal to pass to the drain terminal 59 (so as to yield an output signal) can be controlled by application of bias voltages to the gate 58. For example, application of a first gate voltage can result in the switch 50 being in an "ON" state to allow passage of the input signal from the source terminal 56 to the drain terminal 59; while application of a second gate voltage can turn the switch 50 "OFF" to substantially prevent passage of the input signal.

In certain embodiments, the switch 50 can include a P-well terminal 54 connected to the P-well 53 by a P-type diffusion region 55. In certain embodiments, the P-type diffusion region 55 and the N-type diffusion regions 57 and 60 can be all formed substantially in the P-well 53. In certain embodiments, the P-well terminal 54 can be provided with one or more voltages, or held at one or more electrical potentials, to facilitate controlling of an isolated voltage of the P-well. Examples of such P-well voltages are described herein in greater detail.

In certain embodiments, the switch 50 can include an N-well terminal 61 connected to the N-well 52 by an N-type diffusion region 62. In certain embodiments, the N-type diffusion region 62 can be formed substantially in the N-well 52. In certain embodiments, the N-well terminal 61 can be provided with one or more voltages, or held at one or more electrical potentials, to provide the switch 50 with one or more desired operating performance features. One or more examples of such N-well voltages are described herein in greater detail.

In certain embodiments, the switch 50 can include a P-type substrate terminal 63 connected to the P-type substrate 51 and having a P-type diffusion region 64. In certain embodiments, the P-type diffusion region 64 can be formed substantially in the P-type substrate 51. In certain embodiments, the P-type substrate terminal 63 can be provided with one or more voltages, or held at one or more electrical potentials, to provide the switch 50 with one or more desired operating performance features. One or more examples of such N-well voltages are described herein in greater detail.

Figure 6:
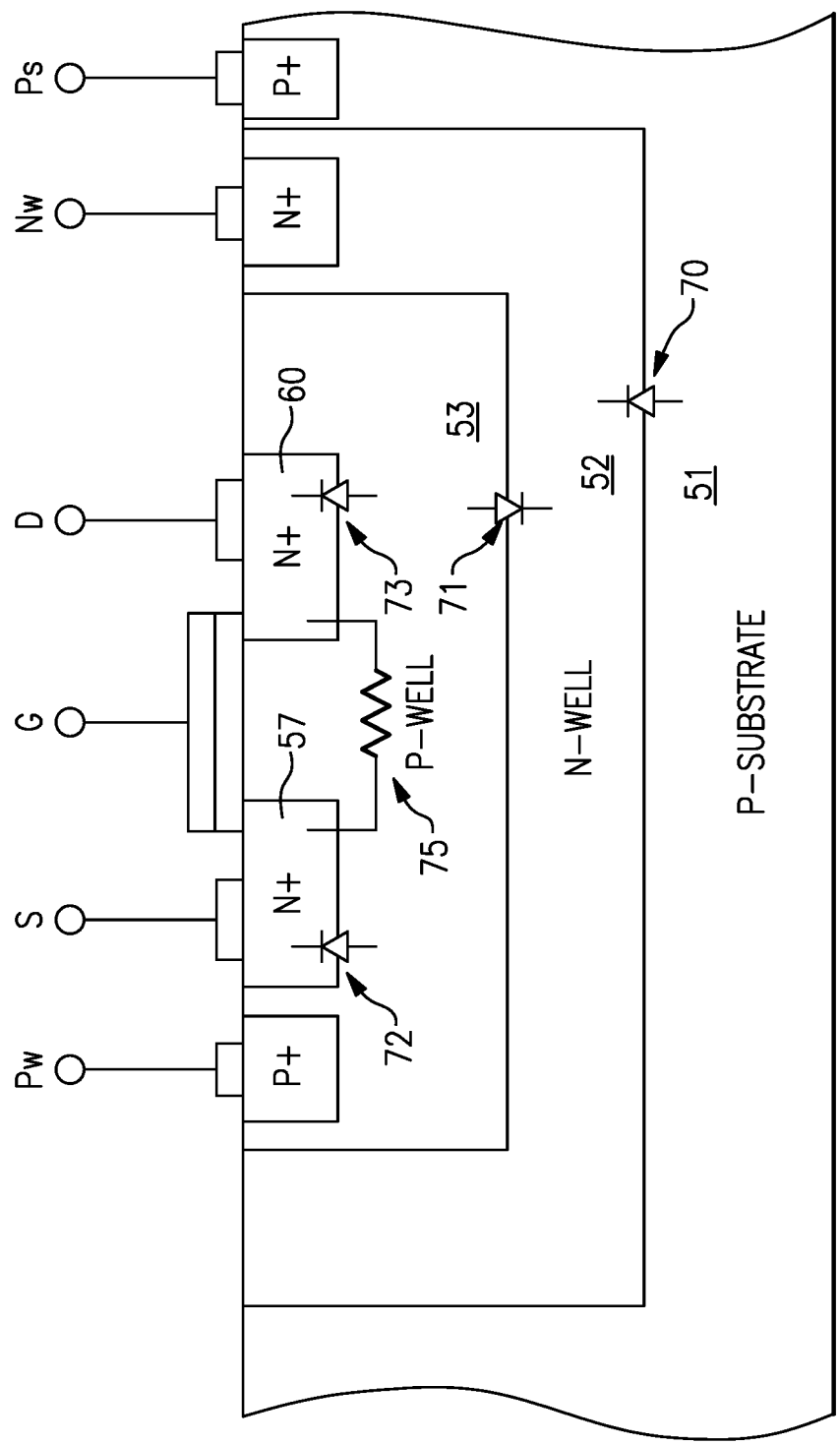
FIG. 6 shows an example configuration for operating the triple-well CMOS switch of FIG. 5.

In the example CMOS device shown in FIG. 5, the switching functionality of the switch 50 is generally provided by an NMOS transistor defined by the N-type diffusion regions (57, 60) in the P-well 53. FIG. 6 shows that for such a configuration, diodes can form at p-n junctions of the triple well structure. For example, a diode 72 can have an anode formed from the P-well 53, and a cathode formed from the N-type diffusion region 57. Similarly, a diode 73 can have an anode formed from the P-well 53 and a cathode formed from the N-type diffusion region 60. Depending on the voltage of the P-well 53 relative to the voltages of the N-type diffusion regions 57 and 60, the diodes 72 and 73 can be biased in, for example, a reverse bias or forward bias region of operation. For the purpose of description herein, bias voltages applied to the N-type diffusion regions 57 and 60 (corresponding to the source and drain terminals, respectively) may or may not be the same. Further, for the purpose of description herein, a reverse bias can include a configuration where a voltage associated with an N-type region is equal to or greater than a voltage associated with a P-type region that forms a p-n junction with the N-type region.

In certain embodiments, the N-type diffusion regions 57 and 60 can be held at substantially the same DC voltage. In certain embodiment, such a configuration can be achieved by providing a relatively large value shunt resistor (e.g., polysilicon resistor) 75 across the source and the drain.

In the context of triple-well CMOS devices, the N-well 52 can substantially isolate the P-well 53 from the P-type substrate 51. In certain embodiments, the presence of the N-well 52 between the P-well 53 and the P-type substrate 51 can result in two additional diodes. As shown in FIG. 6, the illustrated triple well structure can include a diode 71 having an anode formed from the P-well 53 and a cathode formed from the N-well 52. Similarly, the triple well structure can include a diode 70 having an anode formed from the P-type substrate 51 and a cathode formed from the N-well 52.

In certain embodiments, the switch 50 can be operated so as to reverse-bias one or more of the diodes shown in FIG. 6. To maintain such reverse-biases, the source terminal, drain terminal, gate terminal, P-well terminal, N-well terminal, P-substrate terminal, or any combination thereof, can be provided with one or more voltages, or held at one or more electrical potentials. In certain embodiments, such voltages or electrical potentials can also provide one or more additional functionalities that can improve the performance of the switch 50. Non-limiting examples of such performance enhancing features are described herein in greater detail.

Although FIGS. 5 and 6 have described an NMOS transistor as providing the functionality of a switch, a PMOS transistor can also be employed.

Performance of a silicon CMOS switch such as a triple-well CMOS switch can be affected by electrical potentials of various parts of the switch. For the purpose of description, it will be understood that a voltage at a given location refers to a difference in electrical potential between the given location and a reference (e.g., a system ground). Thus, it will also be understood that providing of a voltage can include a situation where a desired electrical potential is held so as to yield a desired potential relative to a reference.

Figure 7:
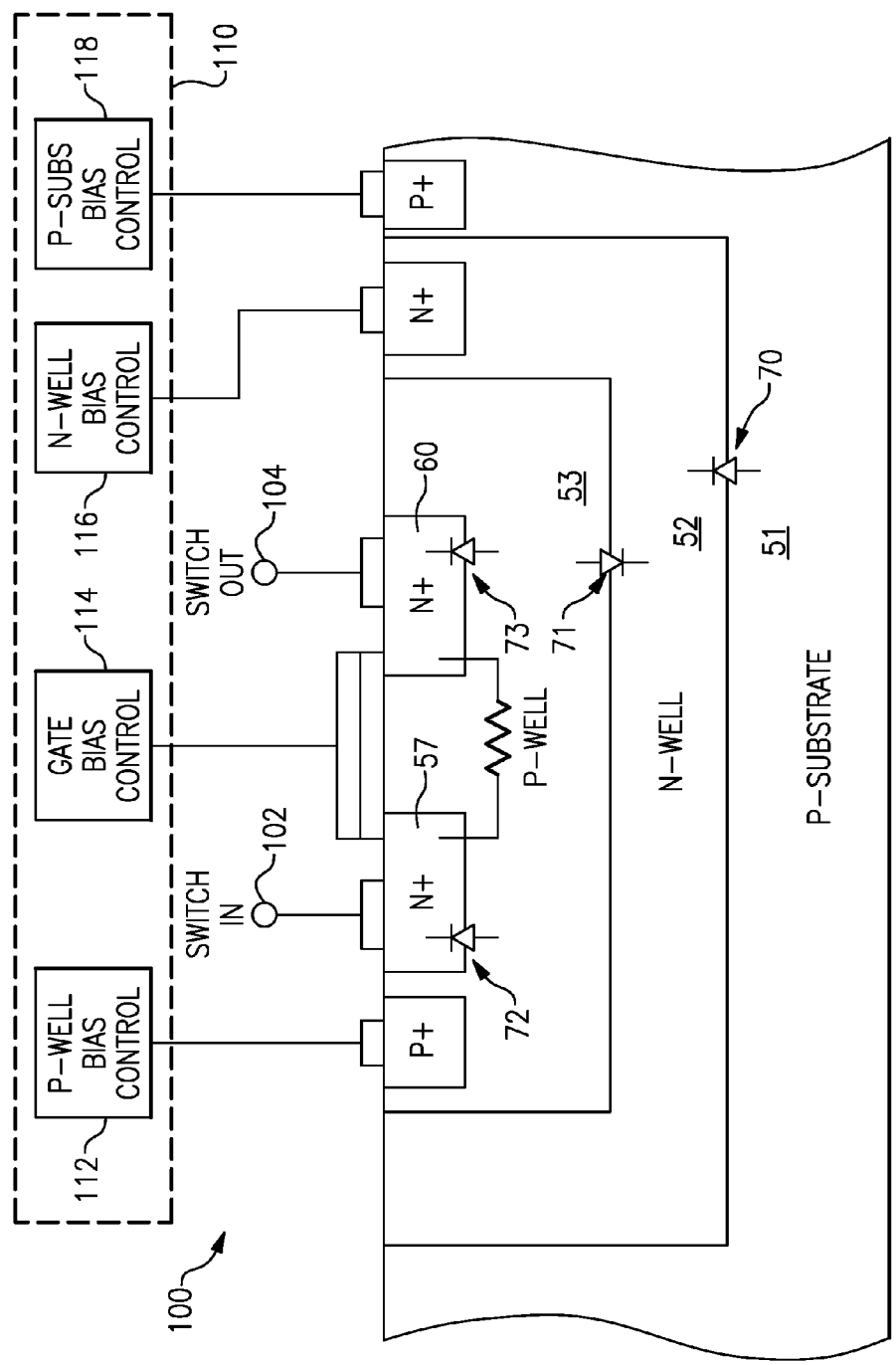
FIG. 7 shows that in certain embodiments, a switch bias control component can be configured to provide desired bias voltages to one or more portions of the triple-well CMOS switch of FIG. 6.

FIG. 7 shows a switch biasing configuration 100, where various voltages can be applied to different parts of a triple-well CMOS switch. In certain embodiments, a reference voltage can be provided to an input (102) and an output (104) of the switch. In certain embodiments, the reference voltage provided to the source (input 102) and drain (output 104) can be a battery voltage (e.g., approximately 4.2 V for certain lithium-ion batteries). It will be understood that other input and output terminal voltage values are possible. Further, input and output terminal voltages may or may not be the same.

In certain embodiments, gate bias voltage can be controlled by a control component 114. Similarly, P-well, N-well, and P-substrate bias voltages can be controlled by components 112, 116, and 118, respectively. For the purpose of description, bias voltage control functionalities provided by the components 112, 114, 116 and 118 are sometimes collectively referred to as a switch bias control component 110. It will be understood that such bias voltage controlling functionalities can be achieved individually, in some combination of one or more control components, or together by a single integrated control component.

In certain embodiments, various voltages applied to the triple-well CMOS switch can be selected so as to maintain the reverse-bias configuration of the various diodes (e.g., 70, 71, 72, 73) formed at various p-n junctions. For example, if the P-substrate portion is held at ground potential, following voltages can maintain the desired reverse-bias of the diodes:

TABLE 1

|  | Approx. voltage (ON state) | Approx. voltage (OFF state) |
|---|---|---|
| P-substrate | 0 | 0 |
| N-well | 11.8 | 11.8 |
| P-well | 4.2 | 1.4 |
| Source/Drain | 4.2 | 4.2 |
| Gate | 7.0 | 1.4 |

Figure 8:
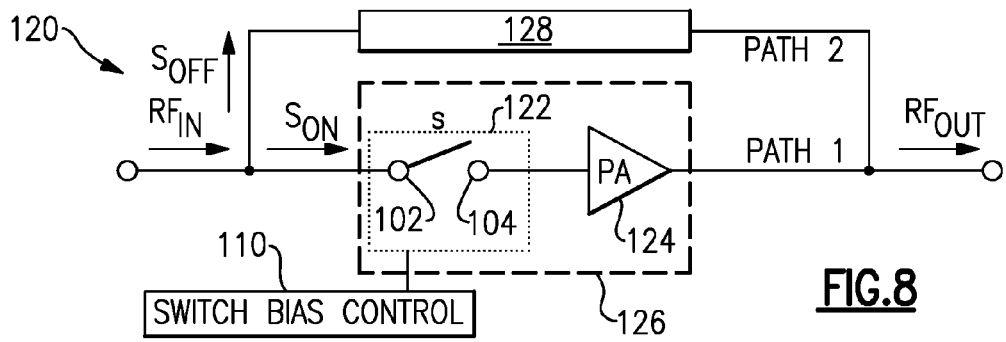
FIG. 8 schematically depicts an example situation where the switch bias control component can control a triple-well CMOS switch for routing RF signals for amplification.

As described herein in reference to FIGS. 4A and 4B, a given amplification mode can be implemented by switching ON and OFF a path associated with one or more power amplifiers associated with that mode. Based on such path-switching features, FIG. 8 schematically depicts a similar switching configuration for an example dual mode amplification circuit 120 configured to receive an input RF signal ($RF_{IN}$) and output an amplified RF signal ($RF_{OUT}$). It will be appreciated that the amplification circuit can include one or more additional paths corresponding to one or more additional power modes.

For the purpose of description, Path 1 can represent a first power mode, and Path 2 can represent a second power mode. For example, Path 1 can represent a medium-power (e.g., PAs 38a and 38b in FIG. 3B) or low-power mode (e.g., PA 38a in FIG. 3B), and Path 2 can represent a high-power mode (e.g., 29a and 29b in FIG. 3B). Similarly, when switching between low and medium power modes, Path 1 can represent a low-power mode, and Path 2 can represent a medium-power mode.

For the purpose of description, FIG. 8 shows a first assembly 126 of a first switch 122 and a first power amplifier 124 corresponding to the first path (Path 1). A second assembly corresponding to the second path (Path 2) is simply depicted as a block 128, and may or may not have similar switch and power amplifier. It will be understood that the first and second assemblies 126, 128 may or may not be on the same die. In certain embodiments, at least the first assembly 126 can be formed on a CMOS die. In certain embodiments, at least the first switch 122 can be formed on a CMOS die. In certain embodiments, the first switch 122 can be a triple-well CMOS switch.

As shown in FIG. 8, the power mode associated with Path 1 can be activated when the first switch 122 is in its ON state ($S_{on}$). In such a state, the input RF signal is transmitted through Path 1 via input and output switch terminals (102, 104) being closed, and amplified by the first power amplifier 124. When the first switch 122 is in its OFF state ($S_{off}$), the input RF signal is shunted to Path 2 for the second power mode operation.

FIG. 8 shows that in certain embodiments, various voltage biasing control for the switch 122 can be controlled by the switch bias control component described in reference to FIG. 7. Various non-limiting examples of such voltage controls are described herein in greater detail.

Figure 9A:
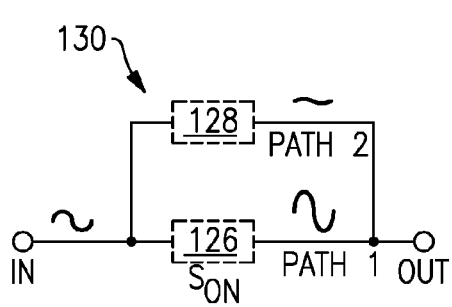
FIGS. 9A and 9B schematically depict an example of how the amplification of RF signals can include first and second paths having first and second gains.
Figure 9B:
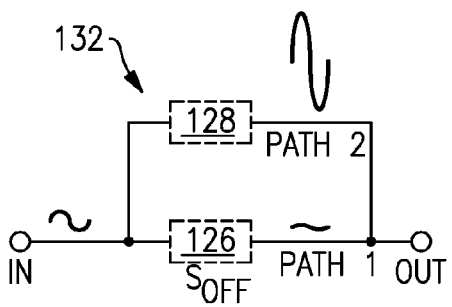

FIGS. 9A and 9B show an example where the first and second power modes can represent low and high power modes, respectively. In the context of cellular phones, having such a low-power/high-power switching capability can provide desirable features such as extended battery life and reducing un-necessary RF power during transmission (e.g., if a cell antenna is nearby).

In FIG. 9A representative of a low-power configuration 130, the switch (not shown) corresponding to the first assembly 126 of Path 1 is ON. Accordingly, an input RF signal is depicted as being amplified with a relatively low gain so as to yield a low gain output RF signal. In the low-power configuration 130, the second assembly 128 is not amplifying the input RF signal (e.g., by having its switch turned OFF). However, there may be quiescent current passing through the second assembly 128 of Path 2.

In FIG. 9B representative of a high-power configuration 132, the switch (not shown) corresponding to the first assembly 126 of Path 1 is OFF. Accordingly, an input RF signal is depicted as being shunted to the second assembly 128 of Path 2 to be amplified with a relatively high gain so as to yield a high gain output RF signal. In the high-power configuration 132, the first power amplifier (124) of the first assembly 126 is not amplifying the input RF signal (e.g., by having the switch 122 turned OFF). However, there may be quiescent current passing through the switch 122 and/or the first power amplifier 124.

Figure 10:
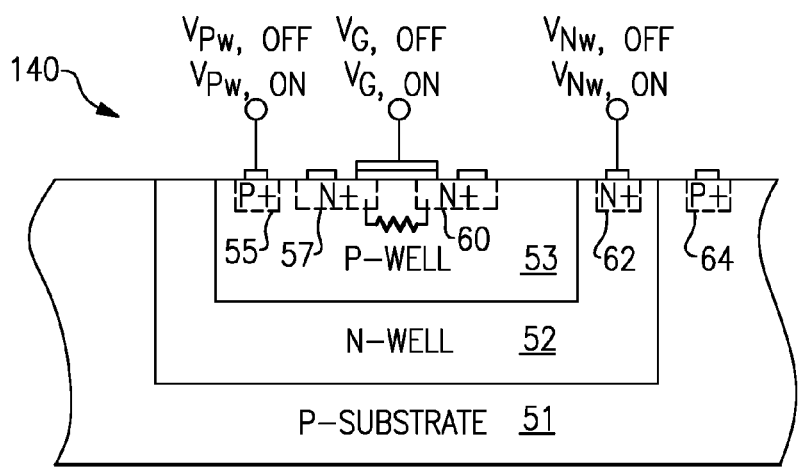
FIG. 10 shows that in certain embodiments, one or more terminals of the triple-well CMOS switch can be provided with more than one selected bias voltages for different states of the switch.

FIG. 10 shows that in certain embodiments, a switch configuration 140 can be implemented for a triple-well CMOS switch such as the switch 122 described in reference to FIGS. 8 and 9. In the context of the example amplification circuit 120 (FIG. 8) and power mode configurations 130, 132 (FIGS. 9A and 9B), the switch configuration 140 can include different bias voltages for ON and OFF states of the switch 122 for one or more of the following: $V_{Pw}$ for P-well bias voltage, $V_G$ for gate bias voltage, and $V_{Nw}$ for N-well bias voltage.

In certain embodiments, the P-well bias voltage ($V_{Pw}$) for the triple-well CMOS switch 122 can be controlled to have different values for the switch's ON and OFF states. Such different bias voltages can be selected to provide advantageous features such as manufacturability and robustness of the switch, and improved linearity of the amplification circuit 120 (e.g., during the high-power mode).

For example, when the amplification circuit 120 is in the high-power mode (132 in FIG. 9B), the triple-well CMOS switch 122 can be in its OFF state to shunt the RF signal to the high-power path (Path 2). In certain situations, such shunting of the RF signal can result in limiting or reducing the linearity of the amplification circuit 120 during a high-power transmission operation.

To address such an effect, the P-well bias voltage ($V_{Pw}$) for the OFF state of triple-well CMOS switch 122 can be selected to be relatively low or as low as possible to avoid forward bias of either or both of the P-well (53)/N-type diffusion region (57 and/or 60) junction (e.g., represented by the diode 72 and/or 73 in FIG. 7) and the P-well (53)/N-well (52) junction (e.g., represented by the diode 71). In certain embodiments, the N-well bias voltage ($V_{Nw}$) can be selected to be relatively high so as to facilitate the foregoing avoidance of the forward bias at the P-well/N-well junction.

In certain embodiments, a lower limit of the P-well bias voltage ($V_{Pw}$) for the OFF state of triple-well CMOS switch 122 can be selected so as to avoid a gate oxide (65 in FIG. 5) and the p-n junction breakdown in the CMOS devices as described herein. In certain embodiments, such avoidance of the foregoing breakdown can be facilitated by having the gate bias voltage ($V_G$) lowered when the P-well bias voltage ($V_{Pw}$) is lowered for the OFF state of triple-well CMOS switch 122. In certain embodiments, the gate bias voltage ($V_G$) can be lowered to be substantially the same as the lowered value for the P-well bias voltage ($V_{Pw}$).

When the amplification circuit 120 is in the low-power mode (130 in FIG. 9A), the triple-well CMOS switch 122 can be in its ON state to direct the RF signal to the low-power path (Path 1). In certain embodiments, the P-well bias voltage ($V_{Pw}$) can be selected so as to avoid or reduce the body effect of the P-well, to avoid or reduce the likelihood of gate oxide breakdown, and/or provide a relatively low or acceptable RF switch insertion loss. In certain embodiments, some or all of the foregoing operating parameters can be addressed by selecting the P-well bias voltage ($V_{Pw}$) to be substantially the same as that of the source/drain diffusion regions (57, 60 in FIG. 7).

Figures 11A, 11B:
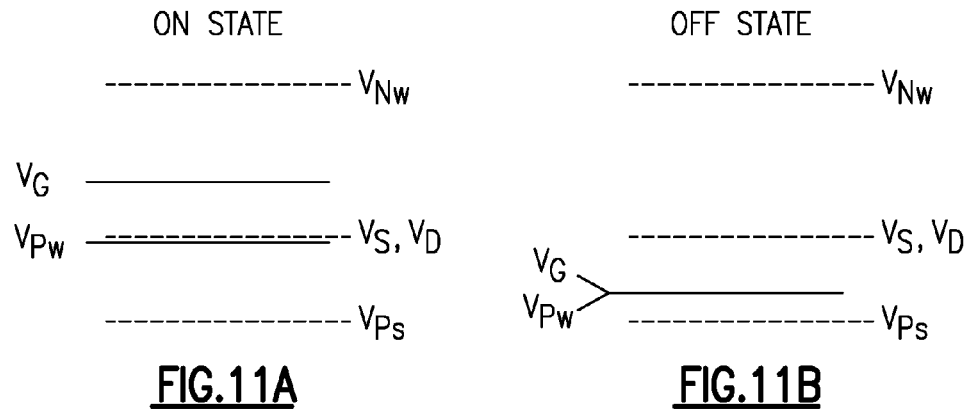
FIGS. 11A and 11B show that in certain embodiments, bias voltages applied to the gate and P-well of the triple-well CMOS switch can be different for ON and OFF states.

FIGS. 11A and 11B depict voltage levels for the foregoing example of selecting the P-well bias voltage ($V_{Pw}$) for the ON and OFF states of the triple-well CMOS switch, and in some situations the gate bias voltage ($V_G$). For the purpose of this example, it will be assumed that the P-substrate is held substantially at a system ground; thus, the P-substrate voltage ($V_{Ps}$) can be substantially zero. Further, it will be assumed that the N-well bias voltage ($V_{Nw}$) and the source/drain bias voltages ($V_S$ and $V_D$) are held at substantially constant values. In certain embodiments, the source/drain bias voltages ($V_S$ and $V_D$) are held substantially at a supply voltage (e.g., battery voltage) at both ON and OFF states. In certain embodiments, however, some or all of $V_{Ps}$, $V_S$ and $V_D$ do not need to be constant.

In certain embodiments, the example set of voltages described herein in reference to Table 1 can address some or all of the various operating features and functionalities described herein in reference to FIGS. 7-11. It will be understood that the example operating voltages of Table 1 are in the context of a battery voltage being at approximately 4.2 volts. Similar relative voltage values can be provided for other systems having different battery voltages.

Figure 12:
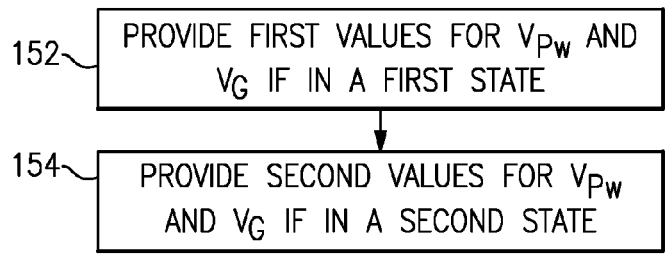
FIG. 12 shows a process that can be implemented to achieve the different gate and P-well voltages for different switch states.

In certain embodiments, a process 150 shown in FIG. 12 can be implemented to provide the selection of operating voltages depicted by way of examples in FIGS. 11 A and 11B. In block 152, first values for $V_{Pw}$, and $V_G$ can be provided to a given triple-well CMOS switch if the switch is in a first state. In block 154, second values for $V_{Pw}$, and $V_G$ can be provided to the switch if the switch is in a second state.

Figure 13:
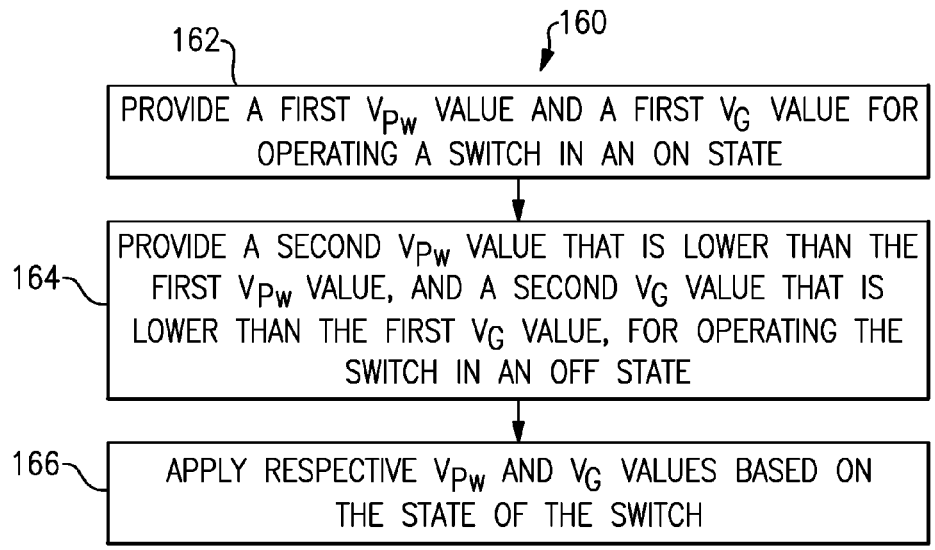
FIG. 13 shows a process that can be a more specific example of the process of FIG. 12.

In certain embodiments, the first and second states referenced in the process 150 of FIG. 12 can represent ON and OFF states of the switch. Accordingly, a process 160 of FIG. 13 can be implemented as a more specific example of the process 150 of FIG. 12.

In block 162, first values for $V_{Pw}$, and $V_G$ can be provided to a given triple-well CMOS switch for operating the switch in an ON state. In block 164, a second value for $V_{Pw}$, can be selected so as to be lower than its first value for operating the switch in an OFF state. In certain embodiments, a second value for $V_G$ can also be selected so as to be lower than its first value for the OFF state. In block 166, the respective selected values of $V_{Pw}$, and $V_G$ can be applied to the switch based on the state of the switch.

In certain embodiments, an amplification circuit such as the circuit 120 (FIG. 8) described herein is preferably configured to effectively pass relatively large power amplifier signals (e.g., in the high-power path such as Path 2 in FIG. 9B) as well as quiescent currents (e.g., when Path 1 of FIG. 9B is in an OFF state). The amplification circuit is also configured to preferably avoid breakdown limits of one or more CMOS switches therein, and maintain a desirable level of linearity. In certain embodiments, such performance features are desirable while the source/drain voltages are varying due to variations in the supply voltage. For example, a supply voltage being provided by a cellular phone battery can decrease or increase. The battery voltage can decrease due to, for example, general discharging of the battery with use, and/or a decrease in operating temperature. The battery voltage can increase due to, for example, recharging of the battery, and/or an increase in operating temperature.

Figure 14A:
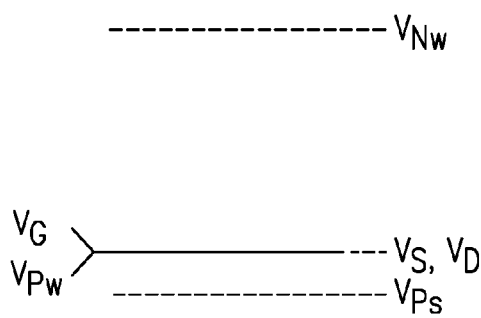
FIGS. 14A and 14B show that in certain embodiments, bias voltages associated with the P-well, source and drain can be coupled so as to change substantially together.
Figure 14B:
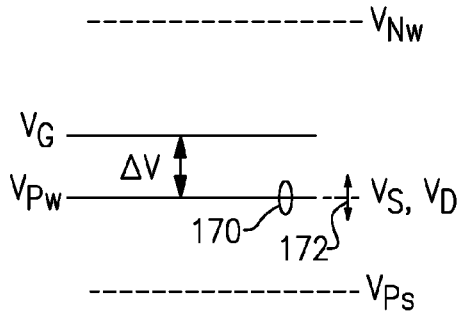

In certain embodiments, the P-well bias voltage ($V_{Pw}$), and in some situations the gate bias voltage ($V_G$), for a triple-well CMOS switch can be controlled to provide one or more of the foregoing performance features. FIGS. 14A and 14B show that in certain embodiments, the P-well bias voltage ($V_{Pw}$) can be selected to substantially track or follow at least one of the voltages associated with the N-type diffusion regions (e.g., 57 and 60 of FIG. 10) of the source and drain. For the purpose of description herein, the N-type diffusion regions of the source and drain can be held at or about the supply (e.g., battery) voltage. Thus, $V_{Pw}$ can be selected to substantially track or follow the supply (e.g., battery) voltage. For the purpose of description, it will be understood that such tracking or following of the supply voltage can include configurations where $V_{Pw}$ is substantially the same as the supply voltage, as well as where $V_{Pw}$ is offset from the supply voltage by some substantially fixed amount.

FIG. 14A shows that in certain embodiments, the P-well bias voltage ($V_{Pw}$) and the gate bias voltage ($V_G$) can be selected to be similar to the example configuration described in reference to FIG. 11B.

FIG. 14B shows that in certain embodiments, the P-well bias voltage ($V_{Pw}$) can be held to be substantially the same as and tracking $V_S$ and $V_D$ (which are substantially the same and substantially equal to the supply voltage) when the switch is in its ON state. Coupling of the P-well bias voltage ($V_{Pw}$) with the source/drain voltage ($V_S$, $V_D$) to provide such tracking of $V_{Pw}$ is depicted by reference numeral 170; and variation of the supply voltage that results in variation of $V_S$ and $V_D$ is depicted by reference numeral 172.

In certain embodiments, the gate bias voltage ($V_G$) for the ON switch can be made to be above the P-well bias voltage ($V_{Pw}$) by a selected amount. Such a gate bias voltage can then remain above $V_{Pw}$ substantially by the selected amount even if the supply voltage varies. In such embodiments, the gate bias voltage can also track the supply voltage by being offset by the selected amount from $V_{Pw}$, (which can substantially track the supply voltage as shown in FIG. 14B). For example, the gate bias voltage ($V_G$) can be established with a charge pump that is reference to the varying supply so as to allow $V_G$ to generally follow the supply voltage, and thus the P-well bias voltage ($V_{Pw}$).

In certain embodiments, the selected amount of difference between $V_G$ and $V_{Pw}$, can be designed to be N×$V_{ts}$, where N is a positive integer and $V_{ts}$ represents a threshold voltage value. Accordingly, by simply changing the multiplier N, a single threshold voltage value can provide a desired difference for between $V_G$ and $V_{Pw}$, to provide a strong inversion of the NMOS RF switch channel.

Figure 15:
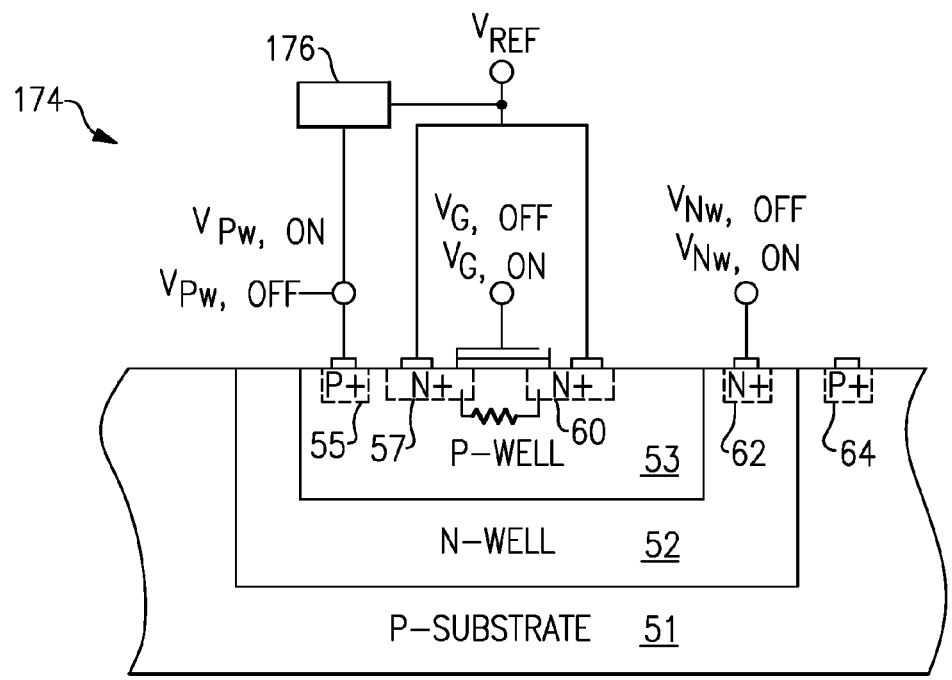
FIG. 15 schematically depicts an example biasing circuit that can be configured to achieve the biasing configuration of FIGS. 14A and 14B.

FIG. 15 shows that in certain embodiments, a coupling circuit 174 can be configured to provide the functionality of coupling the P-well bias voltage with the source/drain bias voltage. In the example circuit 174, the source and drain terminals are shown to be connected to a reference voltage $V_{ref}$ that can represent the supply voltage such as a battery voltage.

As shown in FIG. 15, the reference voltage can be coupled to the P-well terminal via a coupling component 176 such that when the switch is ON, the P-well terminal is provided with substantially the same voltage as $V_{ref}$. In certain embodiments, the P-well terminal can be provided with a different voltage ($V_{Pw,\ OFF}$) when the switch is OFF.

In certain embodiments, one or more features associated with FIGS. 14 and 15 can be facilitated by removing a direct-current (DC) blocking capacitance functionality at the switch's source and drain nodes. Such a design without the capacitive coupling can provide a number of advantageous features, including a reduced cost in materials associated with amplification circuits.

Figure 16A:
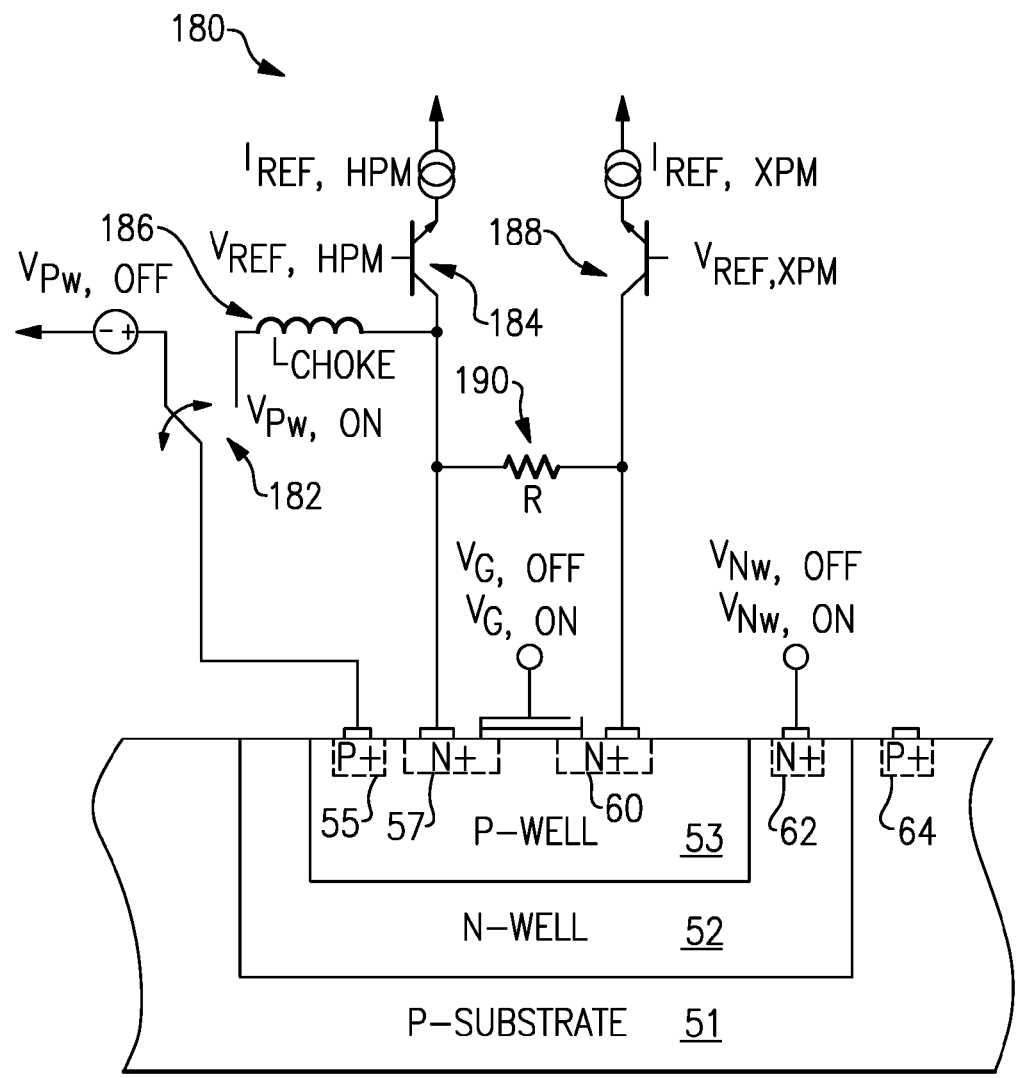
FIGS. 16A and 16B show more specific examples of the biasing circuit of FIG. 15.
Figure 16B:
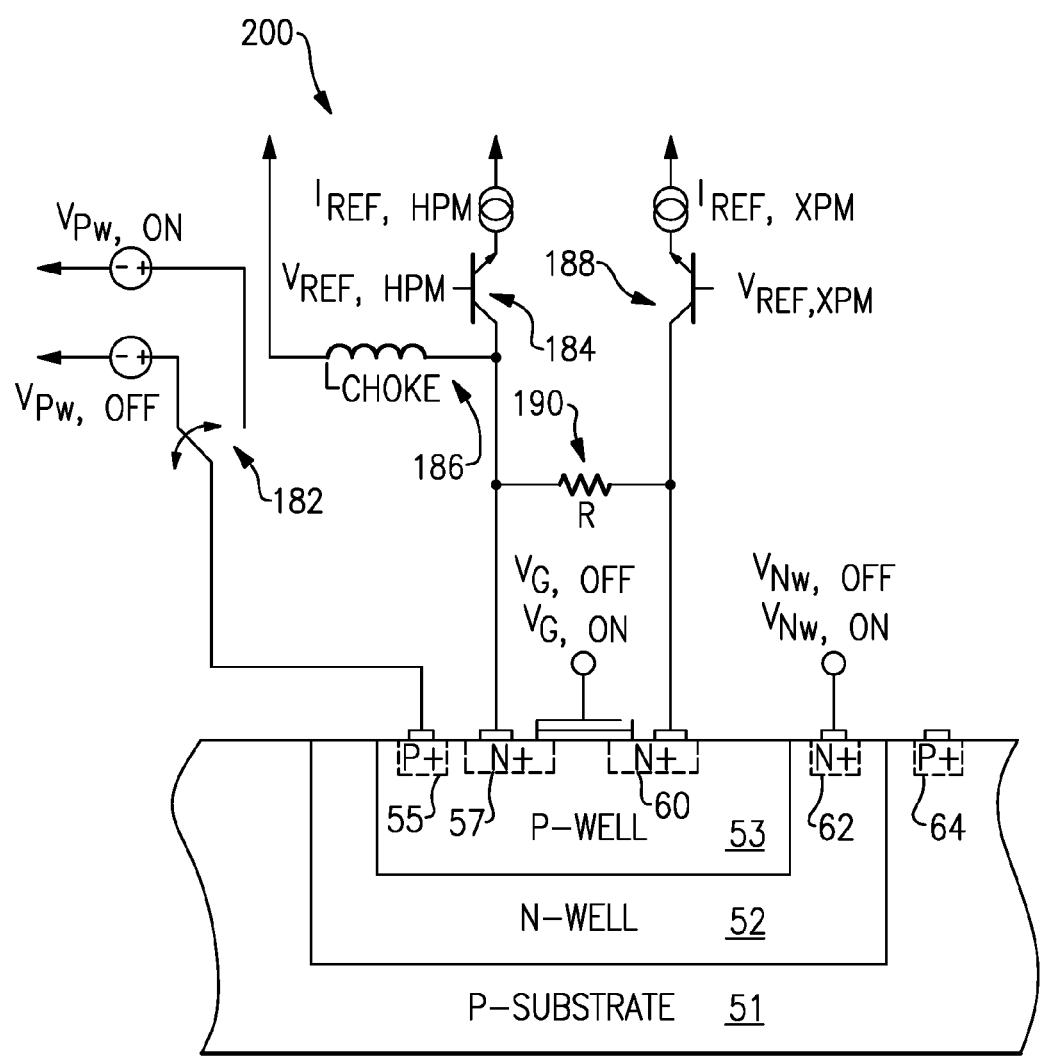

FIGS. 16A and 16B show non-limiting examples of how the P-well terminal can be coupled with the switch's source and drain nodes so as to allow $V_{Pw}$ to track the voltage ($V_S$, $V_D$) associated with the source and drain nodes. In the examples shown in FIGS. 16A and 16B, such coupling circuits can be configured to provide the coupling functionality without a capacitive coupling component.

In an example coupling circuit 180, the gate can be provided with $V_{G,\ OFF}$ and $V_{G,\ ON}$ voltages for OFF and ON states. In certain embodiments, such voltages can be selected as described in reference to FIGS. 14A and 14B.

In certain embodiments, the N-well can be provided with $V_{Nw,\ OFF}$ and $V_{Nw,\ ON}$ voltages for OFF and ON states. Although these voltages are substantially constant in the various examples disclosed herein, they may be selected to be different for the OFF and ON states.

In certain embodiments, bias voltages provided to the source and drain terminals from respective supply sources $I_{ref,\ HPM}$ (via a transistor 184) and $I_{ref,\ XPM}$ (via a transistor 188) can be made to be at substantially the same voltage by use of a relatively large shunt resistor 190 across the source and drain.

In FIG. 16A, coupling of such a supply voltage (e.g., battery voltage) to the P-well voltage $V_{Pw}$ can be achieved by directly coupling at least one of the source and drain nodes to an ON node associated with the P-well voltage control component 182 via a choke 186 having an inductance of $L_{choke}$. In certain embodiments, such an inductive coupling can DC couple the ON voltage $V_{Pw}$ with the supply voltage and inhibit or reduce passage of AC components to the P-well.

In FIG. 16A, the OFF state for the P-well bias voltage is depicted as being controlled to receive a voltage $V_{Pw,\ OFF}$. In certain embodiments, such a voltage can be selected and provided as described herein in reference to FIG. 14A.

In another example coupling circuit 200 shown in FIG. 16B, operations of the gate, N-well, and source and drain can be similar to those described in reference to FIG. 16A. In the circuit 200, however, coupling of the supply voltage (e.g., battery voltage) to the P-well voltage $V_{Pw}$ can be achieved indirectly, where a voltage from at least one of the source and drain nodes is depicted as passing through a choke 186, but not being connected directly to the ON node associated with the P-well voltage control component 182. The voltage source for the ON node for the P-well is depicted as providing $V_{Pw,\ ON}$ and coupled to the choke (186) output at a location not shown in FIG. 16B. In certain embodiments, such an indirect coupling of the P-well with the supply voltage can be achieved by a charge pump (not shown) that is connected to the ON node for the P-well, and referenced to the varying supply (via the choke 186).

Figure 17:
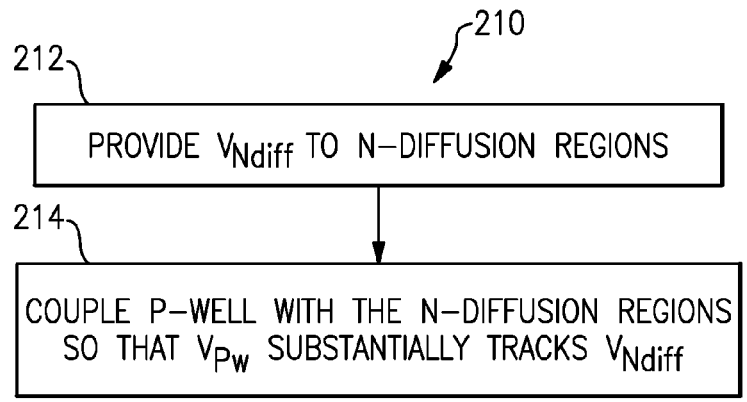
FIG. 17 shows a process that can be implemented so as to provide the voltage coupling between the P-well and at least one of the source and drain terminals.
Figure 18:
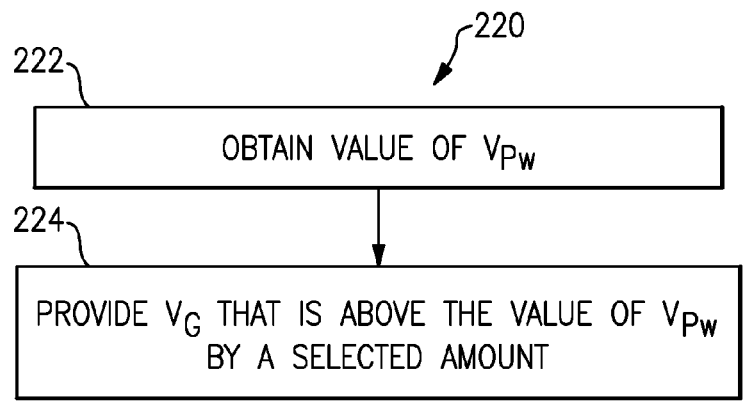
FIG. 18 shows that in certain embodiments, a process can be implemented so as to yield a gate bias voltage that is above a P-well bias voltage by a selected amount.
Figure 19:
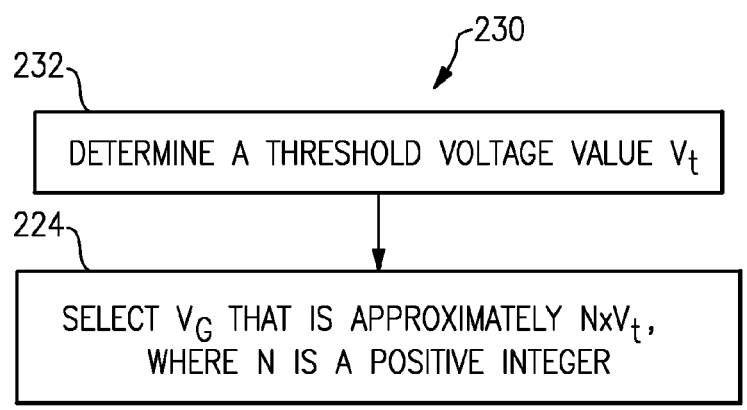
FIG. 19 shows a process that can be implemented to obtain the selected voltage difference amount of FIG. 18.

FIGS. 17-19 show examples of processes that can be implemented to provide various voltage control functionalities described in reference to FIGS. 14-16. FIG. 17 shows that in certain embodiments, a process 210 can be implemented so as to allow the P-well bias voltage ($V_{Pw}$) to track the voltage associated with N-type diffusion regions of the source and drain of a triple-well CMOS switch when the switch is ON. In block 212, a bias voltage $V_{Ndiff}$ can be provided to the N-type diffusion regions of the source and drain. In block 214, the P-well and the N-type diffusion regions can be coupled so that $V_{Pw}$ substantially tracks $V_{Ndiff}$. Such coupling can be achieved directly or indirectly between a source/drain node and the ON node associated with the P-well via a non-capacitive coupling such as an inductive choke.

FIG. 18 shows that in certain embodiments, a process 220 can be implemented so as to allow controlling of the gate bias voltage ($V_G$) for a triple-well CMOS switch when the switch is ON. In block 222, a value for the P-well bias voltage ($V_{Pw}$) can be obtained. In block 224, a value for $V_G$ can be made to be above the value of $V_{Pw}$ by a selected amount. In certain embodiments where $V_{Pw}$ substantially tracks $V_{Ndiff}$, $V_G$ can also change with $V_{Pw}$ (based on $V_G$ being greater than $V_{Pw}$ by the selected amount) when the source/drain bias voltage (e.g., battery voltage) changes.

FIG. 19 shows that in certain embodiments, a process 230 can be implemented so as to allow determination of the selected amount of difference between $V_{Pw}$ and $V_G$. In block 232, a threshold voltage value $V_t$ can be selected. In block 234, the selected amount of difference can be determined by multiplying $V_t$ by a positive integer N. In certain embodiments, such a difference N×$V_t$ can be added to $V_{Pw}$ so as to obtain the gate bias voltage $V_G$.

As described herein, various voltages can be provided to different parts of a triple-well CMOS switch so as to yield one or more performance features. At least some of such voltages can include different values for ON and OFF states of the switch.

Figure 20:
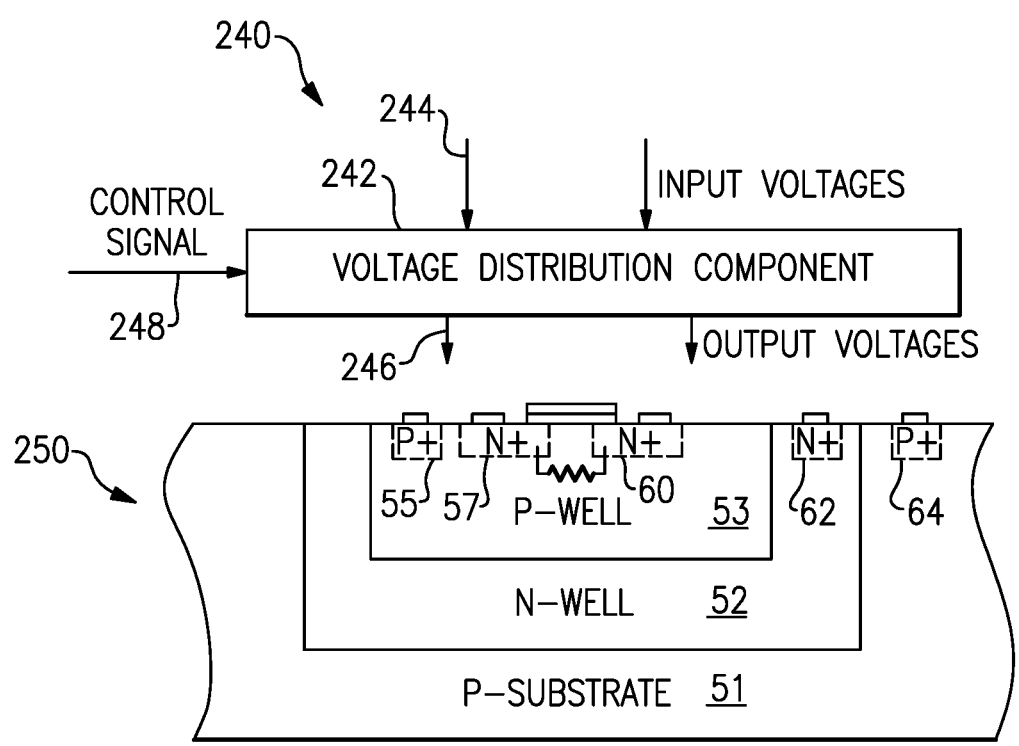
FIG. 20 shows that in certain embodiments, various applications of bias voltages to the triple-well CMOS switch can be facilitated by a voltage distribution component.

FIG. 20 shows that in certain embodiments, one or more bias voltages for controlling the operations of a triple-well CMOS switch 250 can be facilitated by a voltage distribution component 242. Such a component can be configured to receive one or more input voltages (depicted as arrows 244) and distribute one or more output voltages (depicted as arrows 246) to the switch 250. Such distribution of the input 244 to the output 246 can be controlled by a control signal 248.

In certain embodiments, the voltage distribution component 242 can be configured to receive one or more voltages from sources such as supply, charge pump, regulator, and/or other analog voltage sources; and also receive digital logic enable signals. In certain embodiments, input voltages can have relatively low current to facilitate enabling and disabling of one or more triple-well CMOS switches in manners that yield one or more performance features for amplification of RF signals as described herein.

In certain embodiments, the voltage distribution component 242 can be configured such that various voltage distribution functionalities can be achieved via components such as level shifters, combinational logic circuits, transmission gates, and/or voltage buffers. In certain embodiments, design and operation of such components can be achieved by a number of known ways.

Figure 21A:
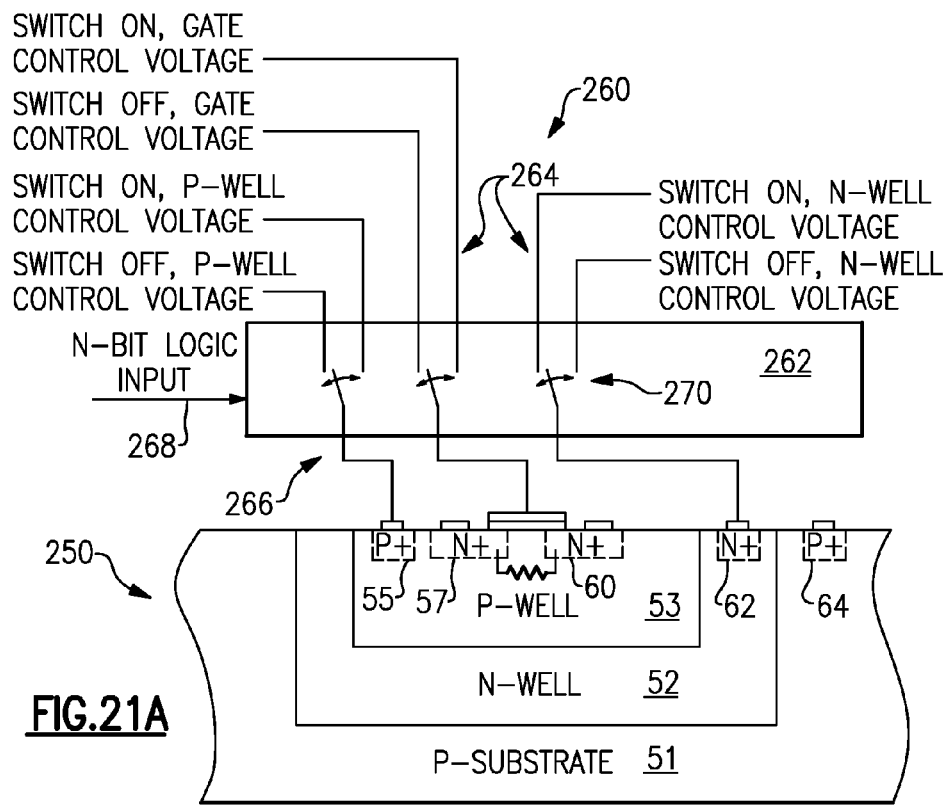
FIGS. 21A and 21B show examples of how the voltage distribution component of FIG. 20 can be configured and controlled.
Figure 21B:
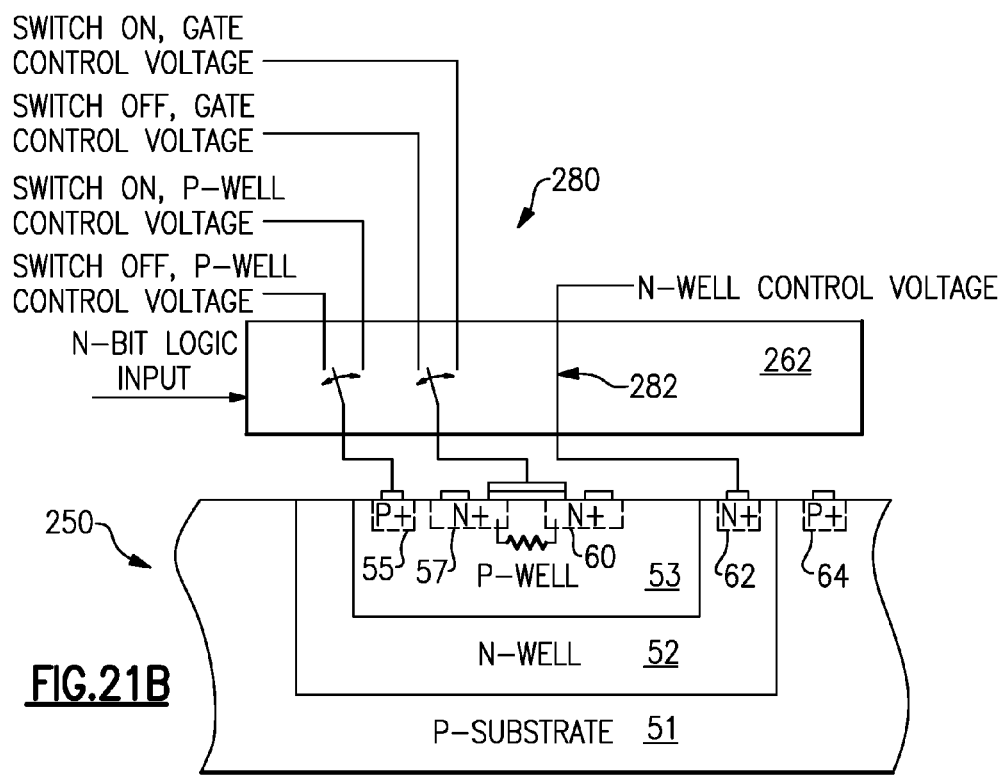

FIGS. 21A and 21B show non-limiting examples of how the voltage distribution component 242 of FIG. 20 can provide voltage distribution functionalities to address some of the voltage control circuits described herein. For example, FIG. 21A shows that in certain embodiments, a voltage distribution component 262 can be configured to distribute and provide bias voltages 266, including those associated with ON and OFF states the P-well, gate and N-well. For each of such switch parts, changing between ON and OFF output voltages can be facilitated by switch or switch-like functionalities (depicted as 270) associated with the voltage distribution component 262. In certain embodiments, such switching between the ON and OFF output voltages can be induced by an N-bit logic input signal, where the number of bits N can be selected based on the number and/or complexity of the output voltages 266.

FIG. 21B shows that in certain embodiments, not all of the input voltages need to be switched between ON and OFF values. For example, some example configurations disclosed herein have the N-well held as a substantially constant value for both ON and OFF states of the switch. Thus, in certain embodiments, the voltage distribution component 262 can be configured so as to include an output that is a pass-through or based on a single input. Such a one-to-one mapping between the input and the output can be achieved by, for example, providing a fixed signal pathway or having a switch or switch-like functionality substantially fixed at one state.

Some of the embodiments described herein have provided examples in connection with wireless devices and/or mobile phones. However, one or more features described herein can be used for any other systems or apparatus that have needs for switching of RF signals, and more particularly, for switching of RF signals to provide different amplifications.

Such one or more features can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an M3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic devices can include unfinished products.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A radio frequency switch comprising:
   a silicon substrate of a first-type;
   an isolation well formed in the substrate, the isolation well of a second-type;
   an isolated well separated from the substrate by the isolation well, the isolated well of the first-type;
   a source and a drain disposed in the isolated well;
   a gate disposed on the isolated well so as to allow switching on and off of electrical conduction between the source and the drain by application of different bias gate voltages; and
   a bias voltage control component electrically connected to the gate, the isolated well, and the isolation well, the bias voltage control component configured to facilitate application of the different bias gate voltages for on and off states of the switch, the bias voltage control component further configured to facilitate application of different bias voltages to at least one of the isolated well and the isolation well for the on and off states of the switch, the isolated well coupled to the source and the drain such that a bias voltage applied to the isolated well substantially tracks a bias voltage applied to the source and the drain.

2. The radio frequency switch of claim 1 wherein the first-type is a p-type and the second-type is an n-type.

3. The radio frequency switch of claim 2 wherein the isolation well includes an N-well and a deep N-well, such that in combination with the isolated well, the N-well and the deep N-well form a triple-well structure in the silicon substrate.

4. The radio frequency switch of claim 3 wherein the gate includes a gate terminal and an oxide layer between the gate terminal and the isolated well so as to form a complementary metal oxide semiconductor structure.

5. The radio frequency switch of claim 1 wherein the bias voltage control component includes a voltage distribution component configured to distribute the different bias voltages to the at least one of the isolated well and the isolation well based on the on or off state of the switch.

6. The radio frequency switch of claim 1 wherein the different bias voltages include a first bias voltage applied to the isolated well for the on state of the switch and a second bias voltage applied to the isolated well for the off state of the switch, and the different bias gate voltages include a first bias gate voltage applied to the gate for the on state of the switch and a second bias gate voltage applied to the gate for the off state of the switch.

7. The radio frequency switch of claim 6 wherein the first bias gate voltage applied to the gate is held at a substantially fixed amount above the first bias voltage applied to the isolated well.

8. The radio frequency switch of claim 6 wherein the second bias voltage applied to the isolated well is substantially equal to the second bias gate voltage applied to the gate.

9. The radio frequency switch of claim 1 wherein the bias voltage applied to the source and the drain is substantially equal to a voltage provided by a supply that is powering the switch such that the bias voltage applied to the isolated well substantially tracks the supply voltage even when the supply voltage changes.

10. The radio frequency switch of claim 1 further comprising one or more diodes formed between the isolated well and one of the source and the drain disposed in the isolated well.

11. The radio frequency switch of claim 1 further comprising a diode formed between the isolation well and one of the isolated well or the silicon substrate.

12. The radio frequency switch of claim 1 wherein the on state of the radio frequency switch results in an radio frequency signal being amplified by a first circuit configured to amplify the radio frequency signal so as to provide a first gain, and the off state of the switch results in the radio frequency signal being amplified by a second circuit configured to amplify the radio frequency signal so as to provide a second gain.

13. The radio frequency switch of claim 12 wherein each of the first and second circuits comprises one or more power amplifiers, and the radio frequency switch is connected in series to the one or more power amplifiers of the first circuit.

14. The radio frequency switch of claim 13 wherein the first gain provided by the one or more power amplifiers of the first circuit is lower than the second gain provided by the one or more power amplifiers of the second circuit.

15. A die comprising the radio frequency switch of claim 1.

16. A wireless device comprising the die of claim 15.

17. A radio frequency switch comprising:
   a silicon substrate of a first-type;
   an isolation well formed in the substrate, the isolation well of a second-type;
   an isolated well separated from the substrate by the isolation well, the isolated well of the first-type;
   a source and a drain disposed in the isolated well;

a gate disposed on the isolated well so as to allow switching on and off of electrical conduction between the source and the drain by application of different bias gate voltages; and a bias voltage control component electrically connected to the gate, the isolated well, and the isolation well, the bias voltage control component configured to facilitate application of the different bias gate voltages for on and off states of the switch, the bias voltage control component further configured to facilitate application of different bias voltages to at least one of the isolated well and the isolation well for the on and off states of the switch, the different bias voltages including a first bias voltage applied to the isolated well for the on state of the switch and a second bias voltage applied to the isolated well for the off state of the switch, and the different bias gate voltages including a first bias gate voltage applied to the gate for the on state of the switch and a second bias gate voltage applied to the gate for the off state of the switch, the first bias voltage applied to the isolated well substantially equal to a bias voltage applied to the source and the drain when the switch is in the on state.

18. A die comprising the radio frequency switch of claim 17.

19. A wireless device comprising the die of claim 18.

20. A radio frequency switch comprising:

a silicon substrate of a first-type;

an isolation well formed in the substrate, the isolation well of a second-type;

an isolated well separated from the substrate by the isolation well, the isolated well of the first-type;

a source and a drain disposed in the isolated well;

a gate disposed on the isolated well so as to allow switching on and off of electrical conduction between the source and the drain by application of different bias gate voltages;

a bias voltage control component electrically connected to the gate, the isolated well, and the isolation well, the bias voltage control component configured to facilitate application of the different bias gate voltages for on and off states of the switch, the bias voltage control component further configured to facilitate application of different bias voltages to at least one of the isolated well and the isolation well for the on and off states of the switch; and a coupling element that electrically connects the isolated well to a reference voltage representative of a supply voltage via one of the source or the drain.

21. The radio frequency switch of claim 20 wherein, when the radio frequency switch is in the on state, the one of the source or the drain electrically connected to the coupling element is provided with a voltage that substantially matches the reference voltage.

22. A die comprising the radio frequency switch of claim 20.

23. A wireless device comprising the die of claim 22.

* * * * *